(12) United States Patent
Hino et al.

(10) Patent No.: US 9,577,086 B2
(45) Date of Patent: Feb. 21, 2017

(54) SEMICONDUCTOR DEVICE

(71) Applicant: MITSUBISHI ELECTRIC CORPORATION, Chiyoda-ku (JP)

(72) Inventors: Shiro Hino, Tokyo (JP); Naruhisa Miura, Tokyo (JP); Masayuki Imaizumi, Tokyo (JP); Kohei Ebihara, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/779,255

(22) PCT Filed: Mar. 27, 2014

(86) PCT No.: PCT/JP2014/058823
§ 371 (c)(1),
(2) Date: Sep. 22, 2015

(87) PCT Pub. No.: WO2014/162969
PCT Pub. Date: Oct. 9, 2014

(65) Prior Publication Data
US 2016/0079411 A1    Mar. 17, 2016

(30) Foreign Application Priority Data

Apr. 3, 2013  (JP) ................. 2013-077566

(51) Int. Cl.
*H01L 29/78*        (2006.01)
*H01L 29/47*        (2006.01)
(Continued)

(52) U.S. Cl.
CPC ....... *H01L 29/7806* (2013.01); *H01L 29/0619* (2013.01); *H01L 29/0696* (2013.01);
(Continued)

(58) Field of Classification Search
CPC ............. H01L 29/0615; H01L 29/0696; H01L 29/7806
See application file for complete search history.

(56) References Cited

U.S. PATENT DOCUMENTS 6,707,128 B2    3/2004  Moriguchi et al.
7,151,280 B2   12/2006  Hayashi et al.
(Continued)

FOREIGN PATENT DOCUMENTS

JP    4-364079 A    12/1992
JP    9-107097 A     4/1997
(Continued)

OTHER PUBLICATIONS

International Search Report issued on Jun. 24, 2014 for PCT/JP2014/058823 filed on Mar. 27, 2014.
(Continued)

*Primary Examiner* — Jose R Diaz
(74) *Attorney, Agent, or Firm* — Oblon, McClelland, Maier & Neustadt, L.L.P.

(57) ABSTRACT

A device that increases a value of current flowing through a whole chip until a p-n diode in a unit cell close to a termination operates and reduces a size of the chip and a cost of the chip resulting from the reduced size. The device includes a second well region located to sandwich the entirety of a plurality of first well regions therein in plan view, a third separation region located to penetrate the second well region from a surface layer of the second well region in a depth direction, and a second Schottky electrode provided on the third separation region.

14 Claims, 20 Drawing Sheets

(51) Int. Cl.
*H01L 29/872* (2006.01)
*H01L 29/12* (2006.01)
*H01L 29/36* (2006.01)
*H01L 29/06* (2006.01)
*H01L 29/16* (2006.01)
*H01L 29/08* (2006.01)
*H01L 29/10* (2006.01)

(52) U.S. Cl.
CPC ...... *H01L 29/0865* (2013.01); *H01L 29/1095* (2013.01); *H01L 29/12* (2013.01); *H01L 29/1608* (2013.01); *H01L 29/36* (2013.01); *H01L 29/47* (2013.01); *H01L 29/78* (2013.01); *H01L 29/872* (2013.01)

(56) References Cited

U.S. PATENT DOCUMENTS

| | | | |
|---|---|---|---|
| 7,791,138 B2* | 9/2010 | Pfirsch | H01L 29/0634 257/337 |
| 7,952,139 B2* | 5/2011 | Bhalla | H01L 29/1095 257/330 |
| 8,003,991 B2 | 8/2011 | Yatsuo et al. | |
| 8,735,968 B2* | 5/2014 | Li | H01L 27/0629 257/328 |
| 2011/0156810 A1 | 6/2011 | Girdhar et al. | |
| 2014/0048847 A1 | 2/2014 | Yamashita et al. | |

FOREIGN PATENT DOCUMENTS

| | | |
|---|---|---|
| JP | 2002-373989 A | 12/2002 |
| JP | 2003-017701 A | 1/2003 |
| JP | 2005-183563 A | 7/2005 |
| JP | 2007-234925 A | 9/2007 |
| JP | 2012-234848 A | 11/2012 |
| JP | 2013-48230 A | 3/2013 |
| WO | WO 2008/153142 A1 | 12/2008 |
| WO | 2012/001837 A1 | 1/2012 |

OTHER PUBLICATIONS

Office Action issued Nov. 10, 2015 in Japanese Patent Application No. 2015-510040 (with English language translation).
International Preliminary Report on Patentability and Written Opinion issued Oct. 15, 2015 in PCT/JP2014/058823.

* cited by examiner

F I G. 1
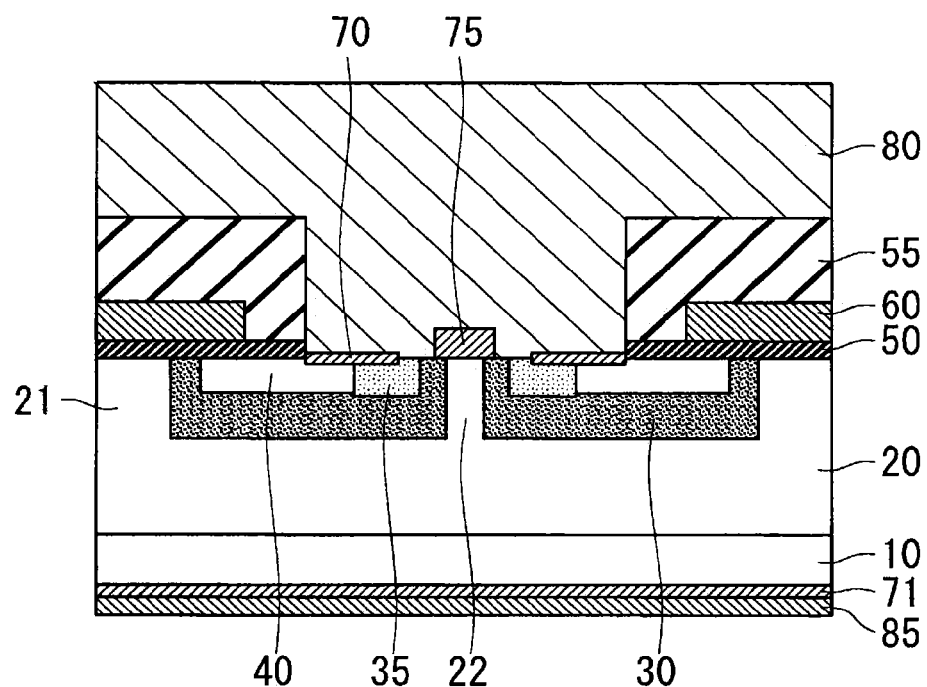
F I G. 2
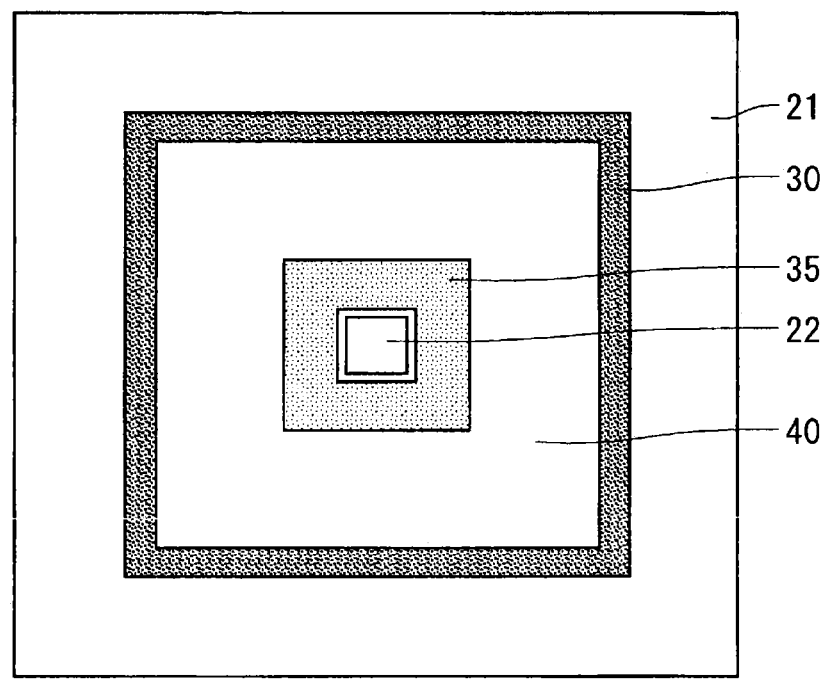

F I G . 3
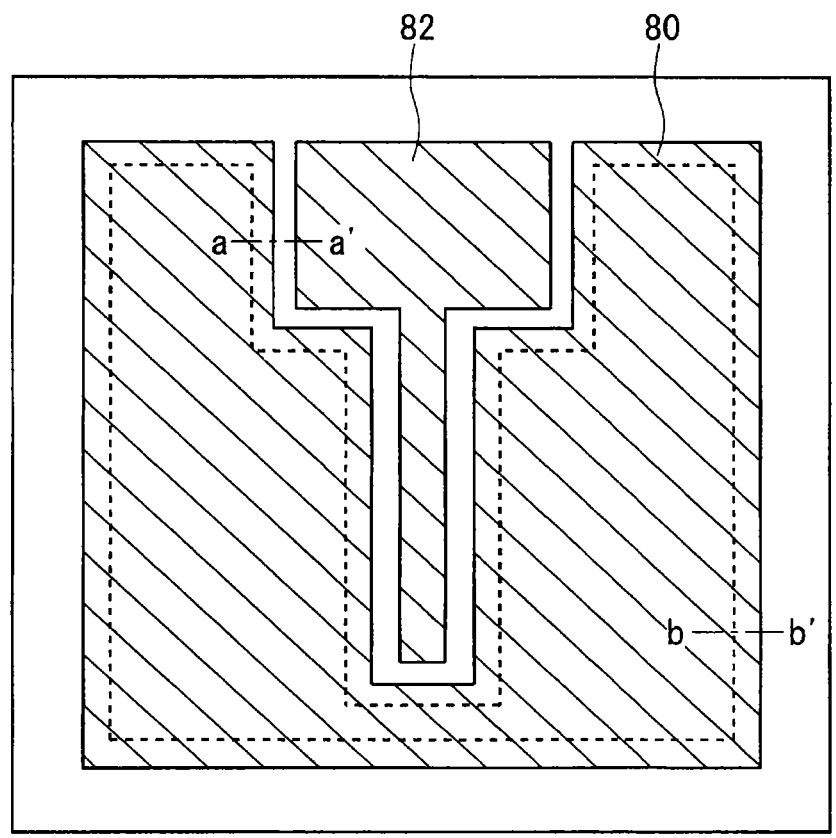

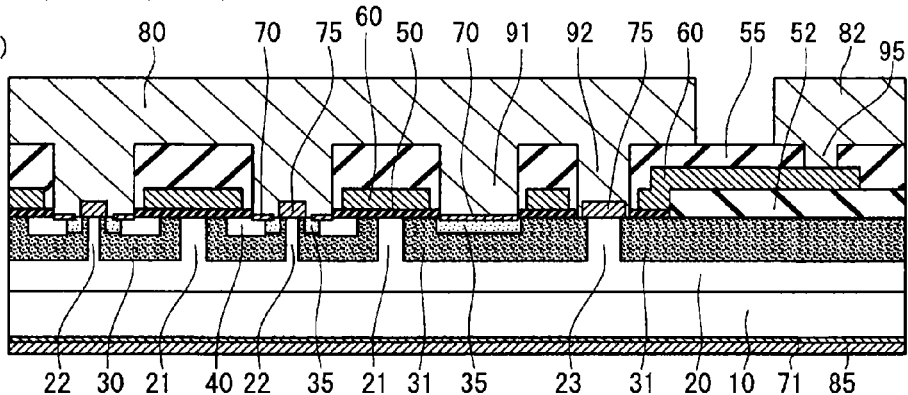
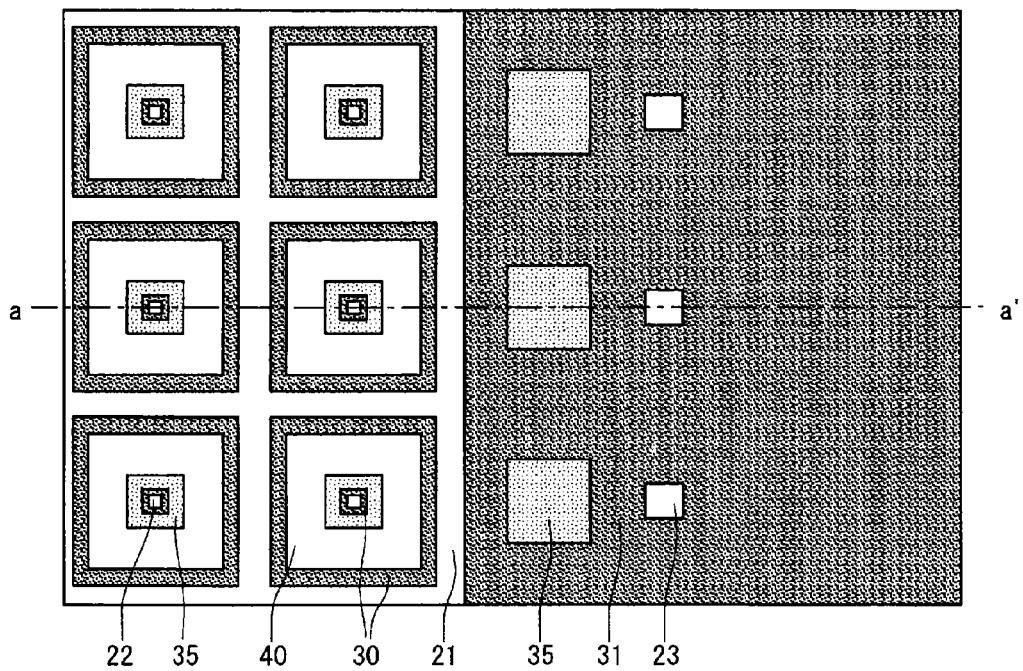
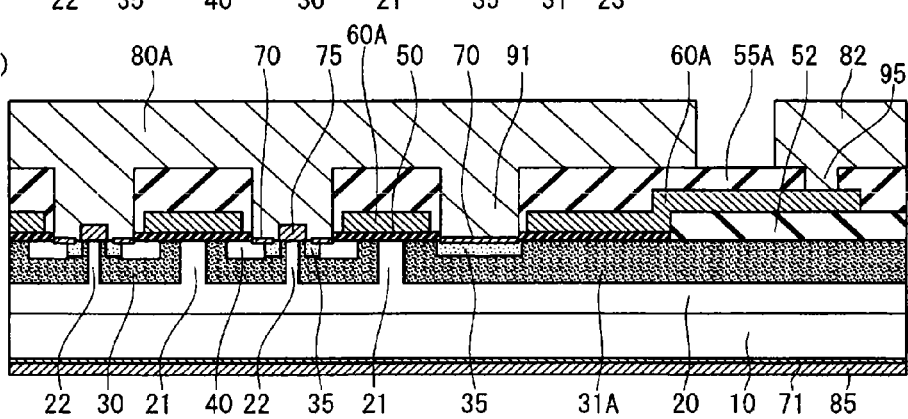
FIG. 4

FIG. 5
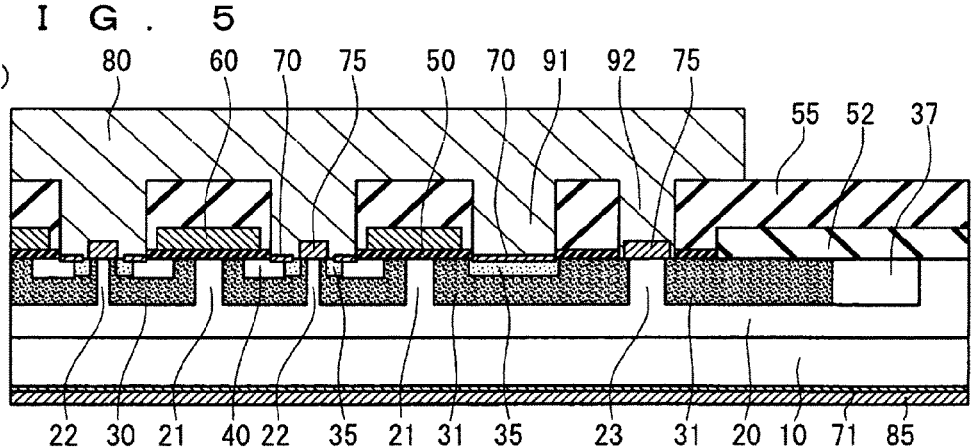
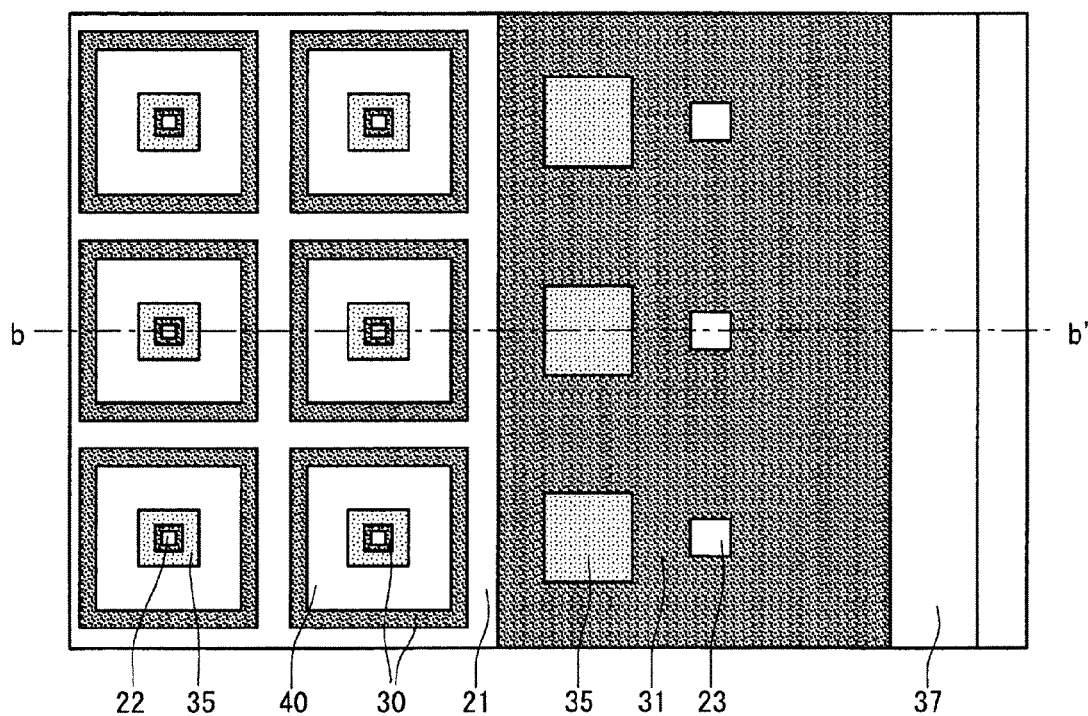
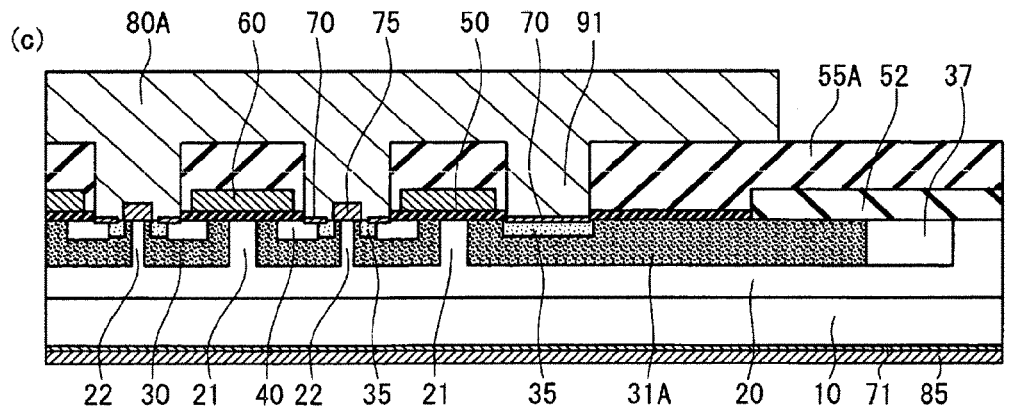

F I G . 8
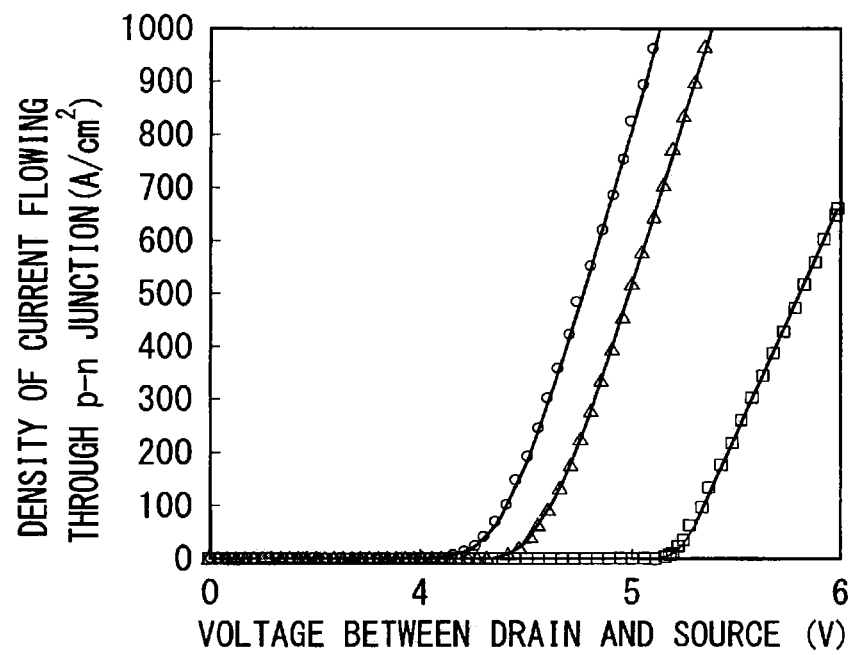

F I G . 2 2
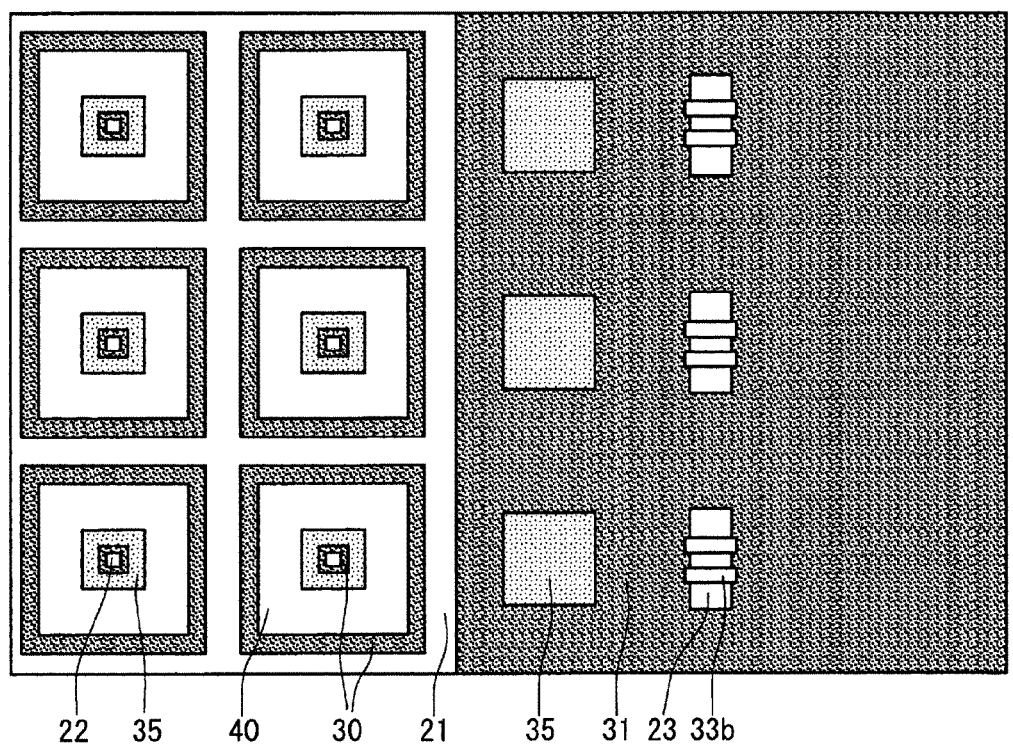

F I G . 2 3
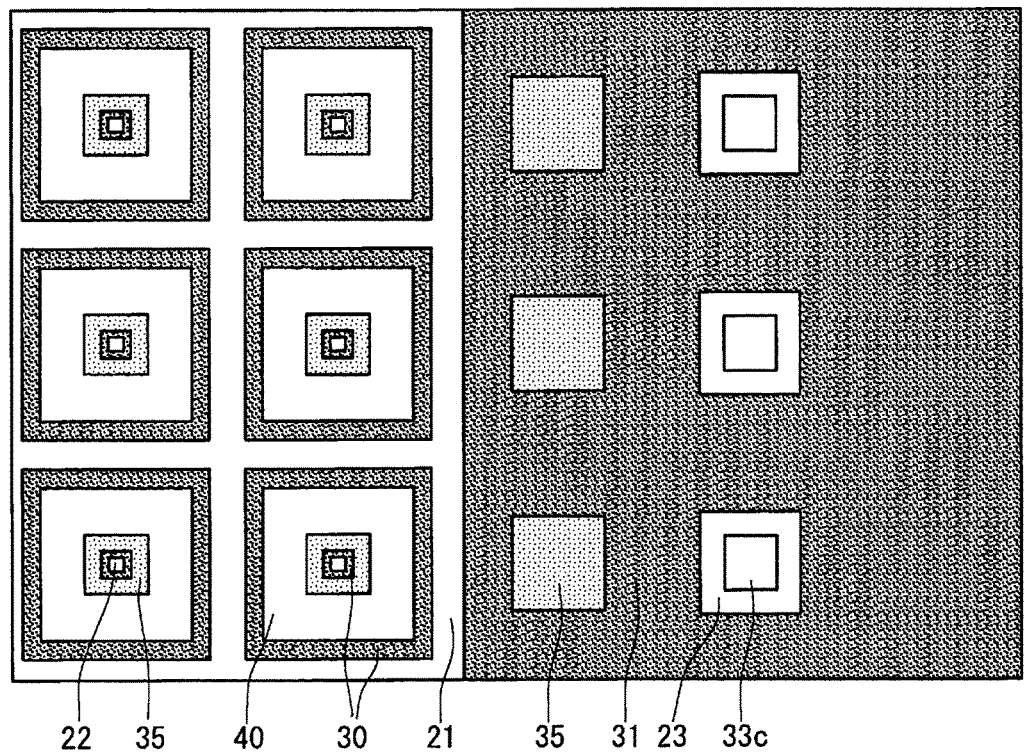
22 35 40 30 21 35 31 23 33c

F I G. 2 5
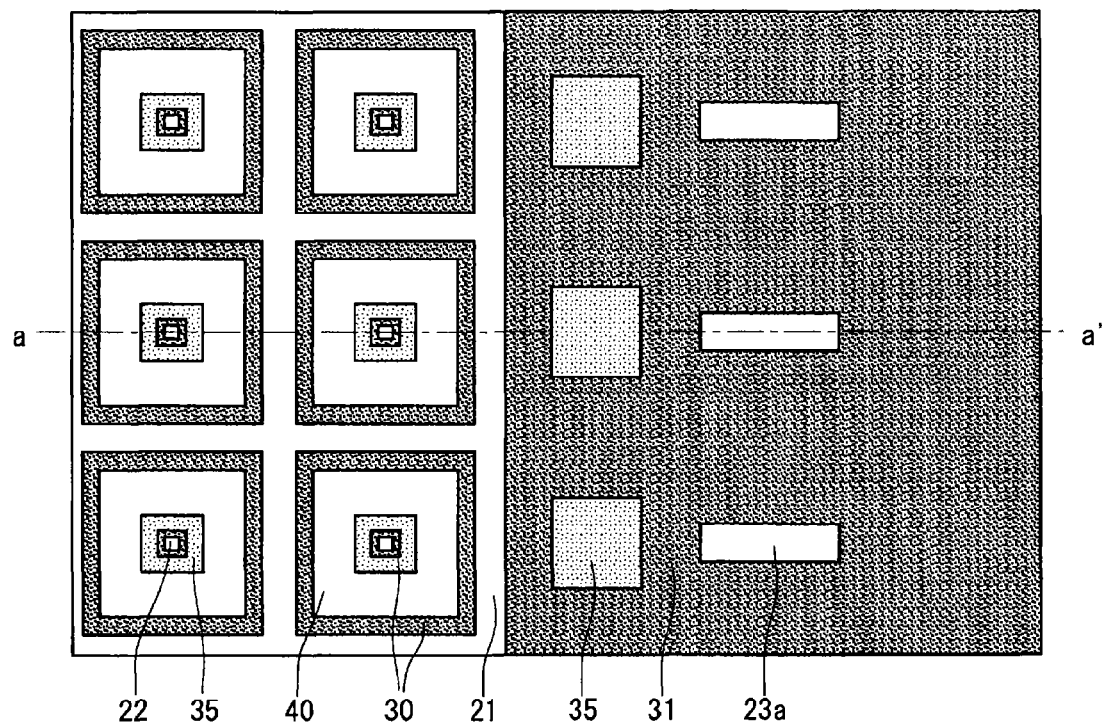
F I G. 2 6
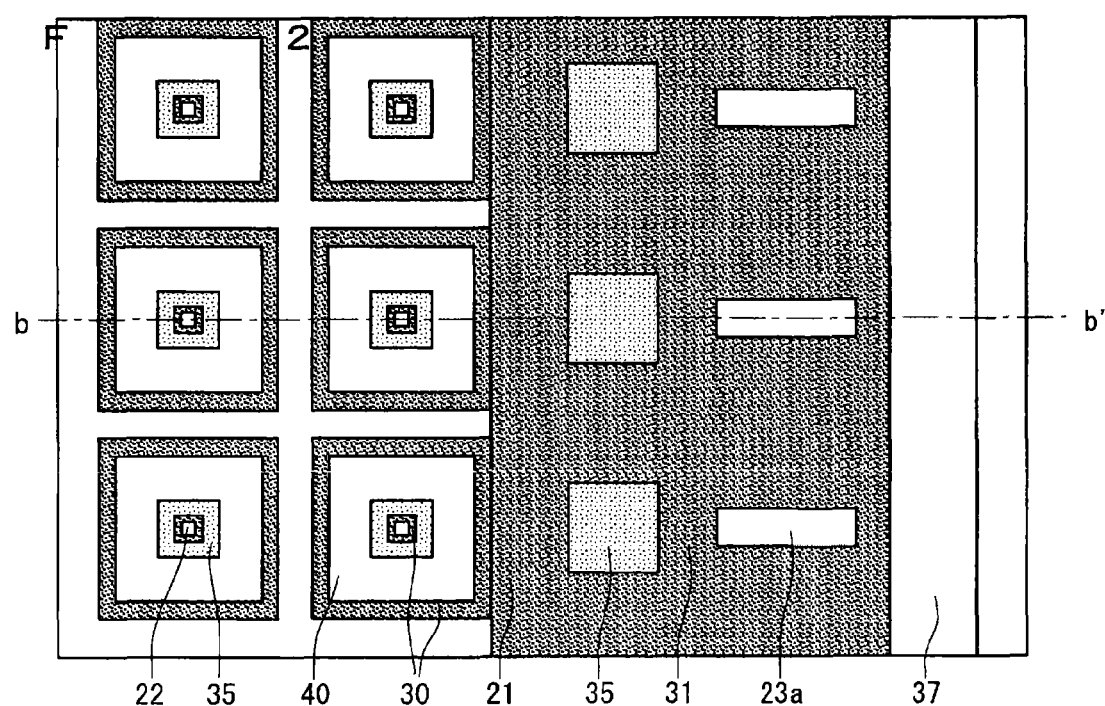

SEMICONDUCTOR DEVICE

TECHNICAL FIELD

The present invention relates to a semiconductor device.

BACKGROUND ART

In semiconductor devices such as metal-oxide-semiconductor field-effect-transistors (MOSFETs), built-in diodes can be used as reflux diodes. For example, Patent Document 1 proposes a method of using Schottky barrier diodes (SBDs) as reflux diodes that are built in unit cells of MOSFETs.

PRIOR ART DOCUMENT

Patent Document

Patent Document 1: Japanese Patent Application Laid-Open No. 2003-017701

SUMMARY OF INVENTION

Problems to be Solved by the Invention

A p-n diode is built in a semiconductor device such as a MOSFET. Thus, when the p-n diode operates in a state in which voltage is applied to the p-n diode in a forward direction, minority carriers are implanted in a drift layer.

Then, the minority carriers that have been implanted recombine with majority carriers in the drift layer, thereby generating energy (recombination energy). It is known that the energy disturbs a periodic structure depending on a semiconductor, that is to say, crystal defects occur. Silicon carbide particularly has great recombination energy due to its great band gap and also has various stable crystal structures, so that the crystal structures are easily changed. Therefore, the operation of the p-n diode easily causes occurrence of the crystal defects.

The disturbed crystal structure electrically has a high resistance, so that this phenomenon occurring particularly in an active region (namely, a region having unit cells including a channel) of the MOSFET increases an ON resistance, namely, an element resistance to a forward current between a source and a drain and increases a conduction loss when passing current in the same density.

The conduction loss is one of predominant losses in the MOSFET, so that the occurrence of the crystal defects in the MOSFET caused by the operation of the p-n diode in the active region increases heat generation of the MOSFET and causes a problem that makes a long-term stable operation difficult.

For the MOSFET with the built-in SBD, a diffusion potential of the SBD is designed lower than a diffusion potential of a p-n junction, and thus a unipolar current flows through the built-in SBD until the p-n diode in the active region operates upon a reflux operation. Thus, a fixed amount of reflux current can be passed in a state in which the p-n diode does not operate, and the increase in the ON resistance can be avoided.

However, in a termination layout described in Patent Document 1, with the increased reflux current flowing through the MOSFET, the p-n diode may be operated by voltage between a source and a drain faster, namely, lower in a unit cell disposed in a region close to the termination than another unit cell among a unit cell group in the MOSFET.

When a semiconductor device is used for a long time in usage conditions that exceed such voltage, the problem arises that an ON resistance increases in the unit cell close to the outer peripheral portion, which also increases an ON resistance in the whole chip.

To suppress the increase in the ON resistance in the whole chip to an allowable amount or less, the reflux current flowing through the whole element needs to be limited to limit the current flowing through the p-n diode in the unit cell disposed in the region close to the termination. This indicates that the size of the chip needed for passing desired current needs to be increased and that a cost of the chip increases.

The present invention has been made in view of the above mentioned problems, and an object thereof is to increase a value of current flowing through the whole chip until a p-n diode in a unit cell close to a termination operates and to reduce a size of the chip and a cost of the chip resulting from the reduced size.

Means to Solve the Problems

A semiconductor device according to one aspect of the present invention, includes: a drift layer of a first conductivity type located on a semiconductor substrate of the first conductivity type; a plurality of first well regions of a second conductivity type provided at an interval in a surface layer of the drift layer; a second well region of the second conductivity type located in the surface layer of the drift layer while sandwiching the entirety of the plurality of first well regions therein in plan view, the second well region having a formation area larger than that of each of the first well regions; a first separation region of the first conductivity type located to penetrate each of the first well regions from a surface layer of each of the first well regions in a depth direction; a source region of the first conductivity type located in the surface layer of each of the first well regions while sandwiching the first separation region therein in plan view; a first Schottky electrode provided on the first separation region; a first ohmic electrode provided over each of the first well regions while sandwiching the first Schottky electrode therein in plan view; a second separation region of the first conductivity type being a region for separating the first well regions from each other; a third separation region of the first conductivity type located to penetrate the second well region from a surface layer of the second well region in the depth direction; a second Schottky electrode provided on the third separation region; a gate electrode provided, through a first insulating film, over the first and second well regions except for positions in which the first and second Schottky electrodes and the first ohmic electrode are provided; a second insulating film located to cover the gate electrode; and a first source electrode provided to cover the first and second Schottky electrodes, the first ohmic electrode, and the second insulating film.

Effects of the Invention

According to the aspect above of the present invention, the second Schottky electrode is provided on the second well region located outside an active region, causing a voltage drop in the second Schottky electrode in a reflux state, and voltage applied to a built-in SBD in the first well regions located at a termination of the active region is thus suppressed. This can suppress operation of a p-n diode, allowing for the reflux of more current in the SBD. As a result, the reflux current as a unipolar current that flows through the whole chip is increased, so that a size of the chip can be reduced.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a schematic cross-sectional view of a unit cell of a MOSFET with a built-in SBD according to a first embodiment.

FIG. 2 is a schematic plan view of the unit cell of the MOSFET with the built-in SBD according to the first embodiment.

FIG. 3 is a schematic plan view schematically showing the whole semiconductor device according to the first embodiment.

FIG. 4 is a schematic cross-sectional view and a schematic plan view of the semiconductor device according to the first embodiment and a schematic cross-sectional view when the present invention is not used.

FIG. 5 is a schematic cross-sectional view and a schematic plan view of the semiconductor device according to the first embodiment and a schematic cross-sectional view when the present invention is not used.

FIG. 8 is a diagram showing a result of simulation that verifies effects of the first embodiment.

FIG. 22 is a schematic cross-sectional view of the semiconductor device according to the seventh embodiment.

FIG. 23 is a schematic cross-sectional view of the semiconductor device according to the seventh embodiment.

FIG. 25 is a schematic cross-sectional view of a semiconductor device according to an eighth embodiment.

FIG. 26 is a schematic cross-sectional view of the semiconductor device according to the eighth embodiment.

DESCRIPTION OF EMBODIMENTS

Figure 6:
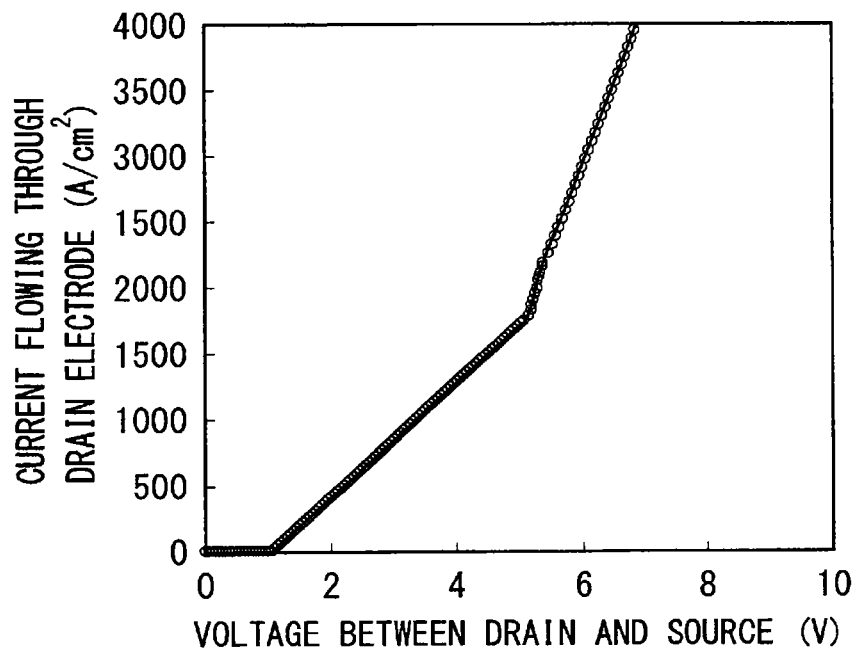
FIG. 6 is a diagram showing a result of calculating current-voltage characteristics in a reflux state of the unit cell of the MOSFET with the built-in SBD by a device simulation.

Hereinafter, embodiments are described with reference to the accompanying drawings. In the embodiments below, a silicon carbide (SiC) semiconductor device is used as an example of a semiconductor device, and particularly, an n-channel silicon carbide MOSFET in which a first conductivity type is an n-type and a second conductivity type is a p-type is described as an example.

First Embodiment

<Configuration>

First, a configuration of a semiconductor device according to a first embodiment is described. FIG. 1 is a schematic cross-sectional view of a unit cell of a MOSFET with a built-in SBD disposed in an active region. FIG. 2 is a diagram of the unit cell of the MOSFET with the built-in SBD shown in FIG. 1 seen from above. FIG. 2 only shows a region in which a semiconductor layer is formed and does not show an electrode, an insulating film, and the like in FIG. 1.

As shown in FIG. 1, in the semiconductor device, a drift layer 20 made of n-type (first conductivity type) silicon carbide is formed on a first main surface of a substrate 10 that has a polytype of 4H and is made of n-type (first conductivity type) silicon carbide having low resistance.

In FIGS. 1 and 2, the substrate 10 made of silicon carbide has the first main surface in a plane direction of a (0001) plane, the first main surface being tilted 4° in a c-axis direction.

The drift layer 20 is an n-type (first conductivity type) semiconductor layer at a first impurity concentration. A plurality of well regions 30 of a p-type (second conductivity type) containing aluminum (Al) being a p-type (second conductivity type) impurity are formed at an interval on a surface layer side of the drift layer 20. A p-type (second conductivity type) impurity concentration in the well regions 30 is a second impurity concentration.

The well regions 30 shown in FIG. 1 are formed in two places at an interval in cross-sectional view of the inside of the unit cell. A region for separating the well regions 30 from each other is an n-type (first conductivity type) region referred to as a second separation region 21. The second separation region 21 is a region formed in the surface layer portion of the drift layer 20 and a region having the same depth as a depth of the well regions 30 from the surface of the drift layer 20 in a depth direction.

Meanwhile, a first separation region 22 of the first conductivity type is formed to penetrate each of the well regions 30 from a surface layer of each of the well regions 30 in a depth direction. The first separation region 22 is a region located directly below a Schottky electrode 75 described below.

A source region 40 of the n-type (first conductivity type) containing nitrogen (N) being an n-type (first conductivity type) impurity is partially formed on the surface layer side of the well regions 30. The source region 40 is formed shallower than the depth of the well regions 30. The source region 40 is formed to sandwich the first separation region 22 therein in plan view.

A first well contact region 35 of a p-type (second conductivity type) containing aluminum (Al) being the p-type (second conductivity type) impurity is preferably formed on each of the well regions 30 sandwiched between the source region 40 and the first separation region 22 on the surface layer side of the drift layer 20.

A gate insulating film 50 made of silicon oxide is formed over the surface of the second separation region 21, the surface of each of the well regions 30, and part of the surface of the source region 40.

Further, a gate electrode 60 is formed on a surface of the gate insulating film 50 so as to face the second separation region 21, the well regions 30, and an end portion of the source region 40. A region of each of the well regions 30 that is sandwiched between the second separation region 21 and the source region 40, faces the gate electrode 60 through the gate insulating film 50, and includes an inversion layer formed during ON operations is referred to as a channel region.

An interlayer insulating film 55 made of silicon oxide is formed on the gate insulating film 50 so as to cover the gate electrode 60. An ohmic electrode 70 on a source side for reducing a contact resistance with silicon carbide is formed on a surface of the source region 40 that is not covered with the gate insulating layer 50 and formed on part of a surface of the first well contact region 35 on a side in contact with the source region 40. The well regions 30 can easily give and receive electrons to and from the ohmic electrode 70 on the source side through the first well contact region 35 having low resistance.

The Schottky electrode 75 is formed on the surface of the first separation region 22 and is Schottky-connected with silicon carbide of the first separation region 22. The Schottky electrode 75 preferably includes at least the surface of the first separation region 22 and may not include it. The Schottky electrode 75 is positioned so as to be sandwiched in the ohmic electrode 70 over the well regions 30 in plan view.

A source electrode 80 is formed on the ohmic electrode 70 on the source side, the Schottky electrode 75, and the interlayer insulating film 55. The source electrode 80 electrically short-circuits the ohmic electrode 70 on the source side and the Schottky electrode 75. In other words, the ohmic electrode 70 on the source side is electrically connected with the Schottky electrode 75.

A drain electrode 85 is formed on a second main surface of the substrate 10 opposite to the first main surface thereof, namely, on a back surface side through a back surface ohmic electrode 71. The gate electrode 60 is electrically short-circuited to a gate pad and gate wiring in part of a region without a unit cell in the semiconductor device through a gate contact hole provided open in the interlayer insulating film 55, which is not shown.

The second separation region 21 is a path through which an ON current flows when the MOSFET is ON, and the first separation region 22 is a path through which a unipolar current being a reflux current of the SBD flows, which will be described below in detail.

FIG. 3 is a diagram seen from above the semiconductor device, namely, a diagram seen from the first main surface side, showing a plan position of the active region by broken lines. The source electrode 80 is formed to include the plan position of the active region. The gate electrode 82 electrically insulated from the source electrode 80 is formed on the first main surface. A region of the whole semiconductor device except for the active region including unit cells arranged periodically is referred to as an ineffective region in this specification.

Part (a) of FIG. 4 is a diagram for describing a structure of a portion of a termination of the active region, the portion being adjacent to the gate electrode 82, and part (a) of FIG. 4 is a schematic cross-sectional view corresponding to a position of a-a' in FIG. 3. Part (b) of FIG. 4 is a schematic plan view of the portion of part (a) of FIG. 4. Part (b) of FIG. 4 only shows the semiconductor region and does not show the electrode, the insulating film, and the like. Part (c) of FIG. 4 is a schematic cross-sectional view of the same place when the present invention is not used.

Part (a) of FIG. 5 is a diagram for describing a structure of a portion of a termination of the active region without the gate electrode 82, the portion being adjacent to a termination of a chip, and part (a) of FIG. 5 is a schematic cross-sectional view corresponding to a position of b-b' in FIG. 3. Part (b) of FIG. 5 is a schematic plan view of the portion of part (a) of FIG. 5. Part (b) of FIG. 5 only shows the semiconductor region and does not show the electrode, the insulating film, and the like. Part (c) of FIG. 5 is a schematic cross-sectional view of the same place when the present invention is not used.

In FIG. 4, the gate electrode 82 is formed on the interlayer insulating film 55 and is electrically connected with the gate electrode 60 through a gate contact hole 95 provided partially open in the interlayer insulating film 55. A wide well region 31 is formed around the active region, and the wide well region 31 and each of the well regions 30 in the unit cells on the outermost periphery sandwich the n-type region having the same width as that of the second separation region 21, the wide well region 31 having a formation area larger than that of each of the well regions 30.

The plan position of the wide well region 31 includes the plan position of the gate electrode 82. The wide well region 31 positioned close to the active region is connected with the source electrode 80 through a well contact hole 91 provided partially open in the interlayer insulating film 55 on a side adjacent to the well regions 30. The first well contact region 35 and the ohmic electrode 70 (second ohmic electrode) are formed in a surface layer portion of the wide well region 31 in contact with the well contact hole 91. A field insulating film 52 is formed over the drift layer 20 and below the gate electrode 60 and is partially positioned farther from the active region than a plan position of the well contact hole 91 and a plan position of an SBD contact hole 92 that is farther from the well regions 30 than the well contact hole 91, the field insulating film 52 having a thickness thicker than that of the gate insulating film 50.

In FIG. 5, the wide well region 31 is formed around the active region, and the wide well region 31 and each of the well regions 30 in the unit cells on the outermost periphery sandwich the n-type region having the same width as that of the second separation region 21, the wide well region 31 having the area larger than that of each of the well regions 30. A junction termination extension (JTE) region 37 of a p-type having an impurity concentration lower than that of the wide well region 31 is formed on a periphery side of the element outside the wide well region 31, and the JTE region 37 is connected with the wide well region 31.

The wide well region 31 is connected with the source electrode 80 through the well contact hole 91 provided partially open in the interlayer insulating film 55 on the side adjacent to the well regions 30. The first well contact region 35 and the ohmic electrode 70 are formed in the surface layer portion of the wide well region 31 in contact with the well contact hole 91.

In both of the position of a-a' (see FIG. 3) and the position of b-b' (see FIG. 3), only when the present invention is used parts (a) and (b) of FIG. 4 and parts (a) and (b) of FIG. 5, the part of the interlayer insulating film 55 and the part of the gate insulating film 50 are removed to form the SBD contact hole 92 positioned close to the well contact hole 91 (for example, a position is 20 [μm] away) and farther from the active region than the well contact hole 91. In other words, in part (c) of FIG. 4, an SBD contact hole is not formed close to a well contact hole 91 for a source electrode 80A, and an interlayer insulating film 55A and a gate electrode 60A are formed on a wide well region 31A in the corresponding portion instead. Also in part (c) of FIG. 5, an SBD contact hole is not formed close to the well contact hole 91 for the source electrode 80A, and the interlayer insulating film 55A is formed over the wide well region 31A in the corresponding portion instead.

The source electrode 80 is in contact with the Schottky electrode 75 through the SBD contact hole 92, the Schottky electrode 75 being formed by deposition on silicon carbide. A third separation region 23 in which the wide well region 31 is not formed is located below the Schottky electrode 75. In other words, the third separation region 23 is a region surrounded by the wide well region 31 and being the n-type region due to a lack of a p-type implantation for forming the wide well region 31. In other words, the third separation region 23 is formed to penetrate the wide well region 31 from a surface layer of the wide well region 31 in the depth direction. Thus, a SBD diode surrounded by the wide well region 31 is formed in the ineffective region.

Diffusion potentials of an SBD diode formed in the active region and the SBD diode formed in the ineffective region are lower than a diffusion potential of a p-n junction formed in silicon carbide.

<Manufacturing Method>

Next, a method for manufacturing the MOSFET with the built-in SBD being the semiconductor device in this embodiment is described.

First, the drift layer 20 that has a thickness of 5 to 50 [μm] and is made of silicon carbide is epitaxially grown on the surface of the substrate 10 that has the polytype of 4H and is made of the n-type silicon carbide having low resistance at an n-type impurity concentration of $1\times10^{15}$ to $1\times10^{17}$ [$cm^{-3}$] by chemical vapor deposition (CVD), the substrate 10 having the first main surface in the plane direction of the (0001) plane.

Next, an implantation mask is formed on the surface of the drift layer 20 by photoresist or the like, and Al being a p-type impurity is ion-implanted. At this time, a depth of the ion implantation of Al is about 0.5 to 3 [μm] and does not exceed the thickness of the drift layer 20. Moreover, an impurity concentration of Al being ion-implanted is in a range of $1\times10^{17}$ to $1\times10^{19}$ [$cm^{-3}$] and is higher than the first impurity concentration in the drift layer 20. Subsequently, the implantation mask is removed. Regions in which Al is ion-implanted in this step are the well regions 30 and the wide well region 31.

Next, an implantation mask is formed on the surface of the drift layer 20 by photoresist or the like, and Al being the p-type impurity is ion-implanted. At this time, a depth of the ion implantation of Al is about 0.5 to 3 [μm] and does not exceed the thickness of the drift layer 20. Moreover, an impurity concentration of Al being ion-implanted is in a range of $1\times10^{16}$ to $1\times10^{18}$ [$cm^{-3}$], is higher than the first impurity concentration in the drift layer 20, and is lower than the concentration of Al in the well regions 30. Subsequently, the implantation mask is removed. A region in which Al is ion-implanted in this step is the JTE region 37.

Next, an implantation mask is formed on the surface of the drift layer 20 by photoresist or the like, and N being the n-type impurity is ion-implanted. A depth of the ion implantation of N is shallower than the thickness of the well regions 30. Moreover, an impurity concentration of N being ion-implanted is in a range of $1\times10^{18}$ to $1\times10^{21}$ [$cm^{-3}$] and exceeds the second impurity concentration of the p-type in the well regions 30. A region of the n-type among regions in which N is implanted in this step is the source region 40.

Next, an implantation mask is formed on the surface of the drift layer 20 by photoresist or the like, Al being the p-type impurity is ion-implanted, and the implantation mask is removed. A region in which Al is implanted in this step is the first well contact region 35. The first well contact region 35 is provided for obtaining sufficient electrical contact between the well regions 30 and the ohmic electrode 70 on the source side, and the p-type impurity concentration in the first well contact region 35 is preferably set at a concentration higher than the second impurity concentration of the p-type in the well regions 30. When the p-type impurity is ion-implanted in this step, the substrate 10 or the drift layer 20 is preferably heated to 150° C. or higher for the ion implantation for the purpose of lowering the resistance in the first well contact region 35.

Next, a heat treatment device performs annealing for 30 seconds to an hour in an atmosphere of inert gas such as argon (Ar) gas (at 1300 to 1900° C.). The annealing electrically activates N and Al being ion-implanted.

Then, the field insulating film 52 that has a thickness of about 0.5 to 2 [μm] and is formed of a silicon dioxide film is formed by the CVD, the photolithography technique, or the like in a region except for the position almost corresponding to the above-mentioned active region. At this time, the field insulating film 52 in the position almost corresponding to the cell region may be removed by the photolithography technique or etching after the field insulating film 52 is entirely formed, for example.

Then, a surface of silicon carbide that is not covered with the field insulating film 52 is thermally oxidized to form silicon oxide being the gate insulating film 50 having a desired thickness. Next, a polycrystalline silicon film having conductivity is formed on the gate insulating film 50 by low pressure CVD, and this is patterned to form the gate electrode 60. Then, the interlayer insulating film 55 is formed by the low pressure CVD. Subsequently, a contact hole that penetrates the interlayer insulating film 55 and the gate insulating film 50 and reaches the first well contact region 35 and the source region 40 in the unit cell is formed, and the well contact hole 91 is formed at the same time.

Next, after a metal film containing Ni as a main component is formed by sputtering or the like, a heat treatment at temperatures of 600 to 1100° C. is performed to cause a reaction to occur between the metal film containing Ni as the main component and the silicon carbide layer in the contact hole, to thereby form a silicide between the silicon carbide layer and the metal film. Then, the metal film remaining on the interlayer insulating film 55 except for the silicide formed by the reaction is removed by wet etching with any of sulfuric acid, nitric acid, and hydrochloric acid or a mixed solution of all of sulfuric acid, nitric acid, and hydrochloric acid and aqueous hydrogen peroxide. This forms the ohmic electrode 70 on the source side.

Subsequently, metal containing Ni as a main component is formed on the back surface (second main surface) of the substrate 10 and is heat-treated, to thereby form the back surface ohmic electrode 71 on the back side of the substrate 10.

Next, the interlayer insulating film 55 on the first separation region 22, the interlayer insulating film 55 in the positions of the gate insulating film 50 and the SBD contact hole 92, and the interlayer insulating film 55 in the positions of the gate insulating film 50 and the gate contact hole 95 are removed using patterning by photoresist or the like. The wet etching that does not damage the surface of silicon carbide being an interface of the SBD is desirable as a way of removal.

Then, the Schottky electrode 75 is deposited by sputtering or the like. Ti, Mo, Ni, or the like is preferably deposited as the Schottky electrode 75.

Subsequently, wiring metal of Al or the like is formed by sputtering or vapor deposition on the surface of the substrate 10 that has been processed so far and is processed into a predetermined shape by the photolithography technique, to thereby form the source electrode 80 in contact with the ohmic electrode 70 on the source side and the Schottky electrode 75 and form the gate electrode 82 in contact with the gate electrode 60.

Furthermore, the drain electrode 85 being the metal film is formed on the surface of the back surface ohmic electrode 71 formed on the back side of the substrate 10, and the semiconductor device shown in FIGS. 1 to 4 is completed.

<Operations>

Next, operations of the MOSFET with the built-in SBD being the semiconductor device in this embodiment are simply described in three states.

The first state, which is hereinafter referred to as an "ON state," is when high voltage is applied to the drain electrode 85 with respect to the source electrode 80 and positive voltage that is greater than or equal to a threshold value is applied to the gate electrode 82.

In the ON state, an inversion channel is formed in the channel region, and a path through which electrons serving as carriers flow is formed between the source region 40 of the n-type and the second separation region 21 of the n-type. On the other hand, an electric filed (reverse bias) in a direction in which current hardly flows for a Schottky junction, namely, a reverse direction is applied to the built-in SBD, so that no current flows.

The electrons flowing from the source electrode 80 to the drain electrode 85 reach the drain electrode 85 from the source electrode 80 through the ohmic electrode 70, the source electrode 40, the channel region, the second separation region 21, the drift layer 20, and then the substrate 10 according to the electric field formed by the positive voltage applied to the drain electrode 85.

Therefore, the positive voltage is applied to the gate electrode 60, which causes the ON current to flow from the drain electrode 85 to the source electrode 80. At this time, voltage applied between the source electrode 80 and the drain electrode 85 is referred to as ON voltage, and a value in which the ON voltage is divided by a density of the ON current is referred to as an ON resistance. The ON resistance is equal to a total of a resistance in the path through which the electrons flow. A product of the ON resistance and the square of the ON current is equal to a conduction loss consumed when the MOSFET is energized, so that the ON resistance is preferably low. The ON current only flows through the active region including the channel and does not flow through the ineffective region.

The second state, which is hereinafter referred to as an "OFF state," is when high voltage is applied to the drain electrode 85 with respect to the source electrode 80 and voltage that is less than or equal to the threshold value is applied to the gate electrode 60.

In the OFF state, the inversion channel is not formed in the channel region, so that the ON current does not flow, and the high voltage in the ON state is applied between the source electrode 80 and the drain electrode 85 of the MOSFET. At this time, the voltage of the gate electrode 82 is about equal to the voltage of the source electrode 80, so that the high voltage is also applied between the gate electrode 82 and the drain electrode 85.

In the active region, the reverse bias is applied to a p-n junction formed between the well regions 30 and the drift layer 20, and a thick depletion layer spreads to the drift layer 20 whose concentration is relatively low, which can prevent application of the voltage to the gate insulating film 50.

Moreover, the gate insulating film 50 on the second separation region 21 does not include a p-type region directly therebelow and is thus applied by electric field strength relatively higher than that applied to the gate insulating film 50 on the well regions 30, but by appropriately limiting the width of the second separation region 21, a depletion layer that horizontally extends from the well regions 30 to the second separation region 21 can suppress the electric field applied to the gate insulating film 50 to a desired value or less. A thin depletion layer spreads in not only the drift layer 20 and the second separation region 21 but also in the well regions 30 of the p-type whose concentration is relatively high, so that holes generated in the depletion layer formed in the well regions 30 are discharged into the source electrode 80 through the first well contact region 35 in a process of shifting to the OFF state. In other words, electrical contact between the well regions 30 and the source electrode 80 is formed, which can prevent application of the high electric field strength to the gate insulating film 50 on the well regions 30 in the OFF state.

In a region of the ineffective region in which the gate electrode 82 is disposed shown in FIG. 4, the wide well region 31 formed in the region almost including the plan positions of the gate insulating film 50 and the field insulating film 52 that are formed on the ineffective region is formed, and the well contact hole 91 for forming electrical contact between the wide well region 31 and the source electrode 80 is formed in part of the wide well region 31. Similarly, this can prevent the application of the high electric field strength to the gate insulating film 50 and the field insulating film 52 on the ineffective region.

In a region of the ineffective region at the termination of the chip shown in FIG. 5, part of the wide well region 31 and the JTE region 37 as well as the drift layer 20 are depleted, to thereby relieve a concentration of electric fields generated at the termination of the element and suppress a decrease in withstand voltage. At this time, holes generated in the depletion layers of the wide well region 31 and the JTE region 37 are discharged into the source electrode 80 through the nearest well contact hole 91.

On the other hand, an electric field in the same direction as that in the "ON state" is applied to the built-in SBD, so that no current flows ideally. However, the electric field applied is much higher than that in the "ON state," and thus a leak current may occur.

The large leak current increases heat generation of the MOSFET, and the MOSFET and a module including the MOSFET may be thermally destroyed. Thus, an electric field applied to the Schottky junction is preferably reduced to low in order to reduce the leak current.

The third state is when a reflux current flows toward the drain electrode 85 from the source electrode 80 in a state where a low voltage is applied to the drain electrode 85 with respect to the source electrode 80, that is to say, a counter electromotive voltage is applied to the MOSFET. This state is hereinafter referred to as a "reflux state."

In the reflux state, an electric field (forward bias) in a forward direction is applied to the built-in SBD, and a unipolar current formed of an electron current flows from the Schottky electrode 75 to the silicon carbide layer. When the voltage of the source electrode 80 with respect to the drain electrode 85 (voltage between the source and the drain) is small, all the reflux current flows through the built-in SBD, and thus no implantation of minority carriers in the drift layer 20 occurs. Thus, crystal defects do not occur, and an ON resistance does not increase.

However, the voltage between the source and the drain further increases, and the p-n diode formed between the well regions 30 and the drift layer 20 in the active region operates under particular conditions, and then the minority carriers are implanted in the drift layer 20 in the active region. As a result, the crystal defects may occur.

The inventors find out that the conditions that cause the p-n diode to operate in the active region are influenced by surroundings of the unit cell. The inventors take that into consideration and discover a technique for hardly causing the operation of the p-n diode in the active region.

For the descriptions, it is assumed that a periodic arrangement of the unit cells endlessly continues for the sake of simplicity. In this case, a device simulation can be performed on the assumption that only the unit cell is cut from the periodicity and a boundary between the unit cell and the adjacent unit cell is insulated.

Figure 7:
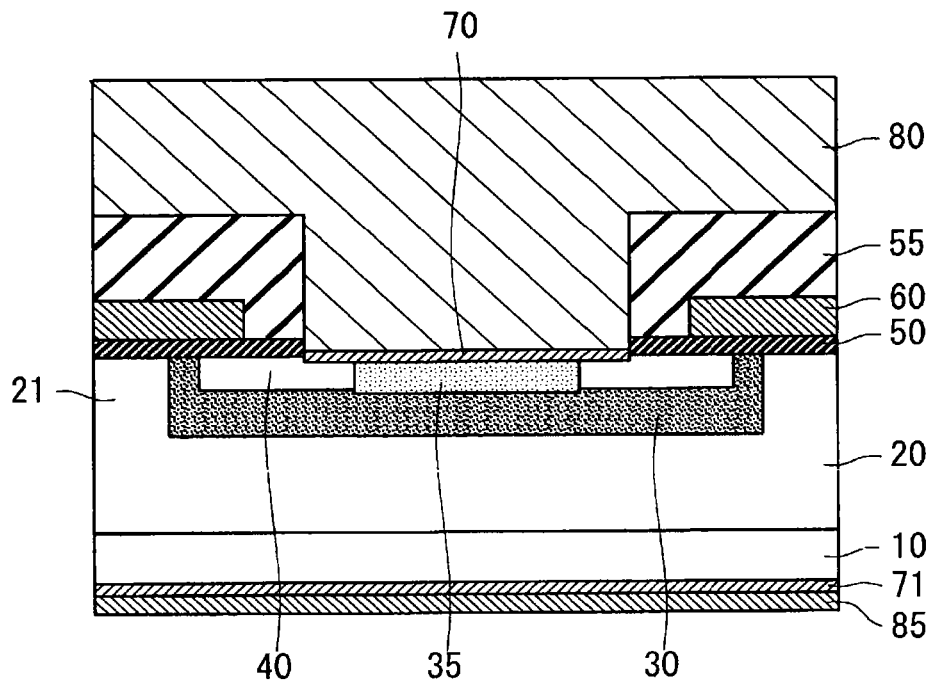
FIG. 7 is a schematic cross-sectional view of a unit cell of a MOSFET without a built-in SBD.

FIG. 6 is a diagram showing a result of calculating current characteristics and voltage characteristics in the reflux state of the unit cell of the MOSFET with the built-in SBD by the device simulation. The vertical axis indicates a current [A/cm$^2$] flowing through a drain electrode while the horizontal axis indicates a voltage [V] between a source and a drain. For comparison purposes, characteristics of a MOSFET without a built-in SBD are also shown, and FIG. 7 shows a cross-sectional view of the MOSFET.

It is clear from the diagram that the voltage between the source and the drain abruptly increases when the current exceeds approximately 5 [V] in the MOSFET with the built-in SBD. The reason is considered that the above-mentioned p-n diode operates, and a unipolar operation is shifted to a bipolar operation, causing conductivity modulation in the drift layer.

It deserves special mention that the voltage between the source and the drain that operates the p-n diode is higher in the MOSFET with the built-in SBD than in the MOSFET without the built-in SBD. This can be described as below. Prior to the descriptions, it is described that the voltage applied to the p-n junction is a potential difference between the well regions 30 and a contact surface of the drift layer 20 with the well regions 30.

First, in the MOSFET without the built-in SBD, when the voltage between the source and the drain is less than or equal to a diffusion potential of the p-n diode, that is to say, the voltage between the source and the drain is less than or equal to the voltage that operates the p-n diode, no current flows between the source and the drain, so that a potential of the drain electrode 85 is equal to a potential of the contact surface of the drift layer 20 with the well regions 30. In other words, all the voltage between the source and the drain is applied to the p-n diode. Therefore, the voltage between the source and the drain is gradually increased, and when the voltage between the source and the drain exceeds the operating voltage of the p-n diode, the operation of the p-n diode, namely, the implantation of the minority carriers in the drift layer 20 starts.

On the other hand, in the MOSFET with the built-in SBD, when the voltage between the source and the drain is higher than the operating voltage of the SBD and is less than or equal to the operating voltage of the p-n diode, a unipolar current flows through the SBD between the source and the drain, causing a voltage drop according to a product of the resistivity and a density of the current in the conduction path. In other words, the voltage drop also occurs in the drift layer 20 and the substrate 10. By an amount of voltage equal to the voltage drop, the potential of the contact surface of the drift layer 20 with the well regions 30 is smaller than the voltage between the source and the drain. As a result of this effect, the voltage between the source and the drain that operates the p-n diode is high in the MOSFET with the built-in SBD, and more unipolar current as the reflux current can be passed until the p-n diode operates.

Moreover, the proximity of the termination of the active region in the MOSFET with the built-in SBD is considered. The unit cells at the termination of the active region are adjacent to the wide well region 31 as described above.

In the structures in which the present invention is not used as shown in part (c) of FIG. 4 and part (c) of FIG. 5, no unipolar current can flow through the wide well region 31A, so that most of the voltage between the source and the drain is applied to the p-n diode being the junction between the wide well region 31A and the drift layer 20.

Therefore, the voltage between the source and the drain exceeds the operating voltage of the p-n diode, causing the implantation of the minority carriers in the drift layer 20 from the wide well region 31A. At this time, a bipolar current flowing through the wide well region 31A mainly flows through the p-n junction close to the well contact hole 91. The reason is that a sheet resistance in the wide well region 31A is a parasitic resistance in a case where a current flows through a p-n junction spaced from the well contact hole 91 in plan view, the current flowing through the wide well region 31A from the well contact hole 91 to the p-n junction portion.

The problem herein is that the minority carriers implanted at this time are diffused not only in the drift layer 20 directly below the wide well region 31A but also in the drift layer 20 directly below the well regions 30 in the adjacent active region. Holes diffused in the drift layer 20 in the adjacent active region recombine with electrons in this place, causing crystal defects in the drift layer in the active region, and thus a resistance when an ON current flows through the active region, namely, an ON resistance is increased.

The problem also arises that a mechanism below causes the bipolar operation at the p-n junction formed between the well regions 30 and the drift layer 20 in the active region. First, when the minority carriers are implanted from the wide well region 31A in the drift layer 20 of unit cells adjacent to the wide well region 31A, namely, the unit cells on the outermost periphery in the active region, electrons as the majority carriers are implanted from the substrate 10 and a density of the electrons increases to satisfy charge neutral conditions. As a result, the resistivity of the drift layer 20 is decreased. With the decrease in the resistivity of the drift layer 20, a voltage drop occurring in the drift layer 20 decreases and the voltage applied to the p-n junction increases.

Therefore, the voltage applied to the p-n diode increases in the unit cells on the outermost periphery, and the bipolar operation starts at the voltage between the source and the drain lower than that in the case where the periodic arrangement of the unit cells endlessly continues as described above. Furthermore, the bipolar operation starts in the unit cells on the outermost periphery, causing the diffusion of the minority carriers also in the inner unit cells. Thus, the bipolar operation of the p-n diode in the wide well region 31A causes the bipolar operation in each unit cell from the adjacent unit cell toward the inside of the active region. This effect is gradually reduced with the spread to the inner unit cells, so that the cells on the outermost periphery have the lowest voltage between the source and the drain for causing the start of the bipolar operation in each of the unit cells, and the cell closer to the inside has the characteristics similarly in the case where the periodic arrangement of the unit cells endlessly continues as described above.

Therefore, for application of the voltage between the source and the drain that exceeds the operating voltage of the p-n diode in the wide well region 31A, the ON resistance in the whole chip in which crystal defects occur due to the bipolar operation may increase in some of the unit cells close to the wide well region 31A. The larger driving voltage between the source and the drain and the larger reflux current flowing through the whole chip extend a range in which the bipolar operation occurs, so that a density of the reflux current needs to be a fixed value or less to make a region in which the crystal defects may occur to be a fixed size or less. In this manner, however, an area of the chip increases, thereby increasing a cost of the chip.

As is clear from the descriptions above, a decrease in the operating voltage of the p-n diode in the unit cells on the periphery results from that the holes diffuse in the drift layer 20 in the adjacent active region to reduce the resistance in the drift layer 20, the holes having been implanted in the drift layer 20 by the bipolar operation in the adjacent wide well region 31A. Reducing the bipolar current in the wide well region 31A is conceivably an effective solution.

In the semiconductor device in this embodiment as shown in parts (a) and (b) of FIG. 4 and parts (a) and (b) of FIG. 5, the SBD is formed close to the well contact hole 91 while the wide well region 31 is partially lost. When the voltage between the source and the drain is larger than the diffusion potential of the SBD, a current flows from the SBD disposed close to the well contact hole 91 to the silicon carbide layer. The current is horizontally diffused in the drift layer 20, causing the voltage drop not only in the drift layer 20 and in the substrate 10 directly below the SBD contact hole 92 but also in the drift layer 20 and in the substrate 10 close to the adjacent well contact hole 91. As a result, the voltage applied to the p-n junction close to the region having the SBD contact hole 92 is decreased by the amount of the voltage drop. Thus, the bipolar operation in the unit cells on the periphery can be suppressed up to the higher voltage between the source and the drain.

To diffuse the current flowing from the SBD also to the lower portion of the well contact hole 91, the plan position of the SBD contact hole 92 is preferably close to the plan position of the well contact hole 91. Specifically, the current that has flowed through the SBD spreads at a radiation angle of 45° in the drift layer 20, so that a distance on the surface of the drift layer 20 between the plan position of the well contact hole 91 and the plan position of the SBD contact hole 92 is preferably shorter than the thickness of the drift layer 20 to allow the current to spread to the portion directly below the well contact hole 91 in the drift layer 20. In other words, a distance on the surface of the drift layer 20 between the plan position of the ohmic electrode 70 and the plan position of the third separation region 23 is preferably shorter than the thickness of the drift layer 20.

Meanwhile, the effect of suppressing the bipolar operation of the p-n diode by the SBD current is not expected in the p-n junction between the wide well region 31 and the drift layer 20 located farther from the active region than the SBD contact hole 92, the diffusion of the SBD current failing to sufficiently reach the p-n junction. However, the p-n diode current flowing at that time is limited to a small value because the sheet resistance in the wide well region 31 between the plan position of the operating p-n junction and the plan position of the well contact hole 91 is conducive as the parasitic resistance. A sheet resistance in the p-type well region made of silicon carbide is typically about three digits higher than that made of silicon due to influences of a great difference in energy between an upper end of a valence band and an impurity level of an acceptor and of a small ionization rate, so that the effects of this embodiment can be greatly obtained particularly in the case where silicon carbide is used. The holes that reach the drift layer 20 in the active region can be significantly smaller than those in the case where the present invention is not used because the plan position of the operating p-n junction is far from the active region, and furthermore, the current flowing is also small.

As a result, more reflux current can pass through the whole chip until the bipolar operation starts in the active region close to the termination.

The effects using this embodiment are checked by the device simulation.

In the termination structures in which the present invention is used and is not used respectively shown in parts (a) and (c) of FIG. 5, operations of unit cells adjacent to the wide well region are calculated. For the sake of calculation time, the unit cells are assumed to be ten in each of the structures, and the cross-sectional views in parts (a) and (c) of FIG. 5 are assumed to endlessly continue in the depth direction (unit cells in a stripe shape). To imitate the operations during dead time, the source electrode 80 and the gate electrode 82 are assumed to have potentials of 0 volt, and a negative voltage is assumed to be applied to the drain electrode 85 such that the absolute value is gradually increased, to thereby calculate current that flows through each portion of the device.

FIG. 8 is a diagram in which the horizontal axis indicates a voltage [V] between the drain and the source, and the vertical axis indicates a current [$A/cm^2$] that flows from the first well contact region 35 to the ohmic electrode 70, namely, a bipolar current that flows through the p-n junction formed between the well regions 30 and the drift layer 20 in the unit cells adjacent to the wide well region 31.

Triangular plots indicate a case in which the present invention is used, and circular plots indicate a case in which the present invention is not used. In addition to the presence or absence of the present invention, rectangular plots indicate the characteristics determined by the assumption of only the unit cell shown in FIG. 1.

As compared to the characteristics determined by the assumption of only the unit cell regardless of the presence or absence of the present invention, it is shown that the bipolar current starts to flow from the low voltage between the source and the drain. The bipolar current starts to flow from the higher voltage between the source and the drain when the present invention is used, which is clear that the bipolar operation in the unit cells can be suppressed.

<Effects>

In this embodiment, the semiconductor device includes the drift layer 20, the well regions 30 serving as first well regions, the wide well region 31 serving as a second well region, the first separation region 22, the source region 40, the Schottky electrode 75 including a first and a second Schottky electrodes, the ohmic electrode 70 serving as a first ohmic electrode, the second separation region 21, the third separation region 23, the gate electrode 60, the gate insulating film 50 or the interlayer insulating film 55 serving as a second insulating film, and the source electrode 80 serving as a first source electrode.

The drift layer 20 is a semiconductor layer of the first conductivity type located on the substrate 10 of the first conductivity type.

The first well regions correspond to the plurality of well regions 30 of the second conductivity type provided at an interval in the surface layer of the drift layer 20.

The second well region corresponds to the wide well region 31 of the second conductivity type located in the surface layer of the drift layer 20 while sandwiching the entirety of the plurality of well regions 30 therein in plan view, the wide well region 31 having a formation area larger than that of each of the well regions 30.

The first separation region 22 is a semiconductor layer of the first conductivity type located to penetrate each of the well regions 30 from the surface layer of each of the well regions 30 in the depth direction.

The source region 40 is a semiconductor layer of the first conductivity type located in the surface layer of each of the well regions 30 while sandwiching the first separation region 22 therein in plan view.

The first Schottky electrode corresponds to the Schottky electrode 75 provided on the first separation region 22.

The second Schottky electrode corresponds to the Schottky electrode 75 provided on the third separation region 23.

The first ohmic electrode corresponds to the ohmic electrode 70 provided over each of the well regions 30 while sandwiching the Schottky electrode 75 therein in plan view.

The second separation region 21 is a semiconductor layer of the first conductivity type being a region for separating the well regions 30 from each other.

The third separation region 23 is a semiconductor layer of the first conductivity type located to penetrate the wide well region 31 from the surface layer of the wide well region 31 in the depth direction.

The gate electrode 60 is an electrode provided, through the gate insulating film 50 serving as a first insulating film, over the well regions 30 and the wide well region 31 except for positions in which the Schottky electrode 75 and the ohmic electrode 70 are provided.

The second insulating film corresponds to the interlayer insulating film 55 located to cover the gate electrode 60.

The first source electrode corresponds to the source electrode 80 provided to cover the Schottky electrode 75, the ohmic electrode 70, and the interlayer insulating film 55.

In this configuration, the Schottky electrode 75 is provided on the wide well region 31 located outside the active region, causing the voltage drop in the Schottky electrode 75 in the reflux state, and the voltage applied to the built-in SBD in the well regions 30 located at the termination of the active region is thus suppressed. This can suppress the operation of the p-n diode, allowing for the reflux of more current in the SBD. As a result, the reflux current as the unipolar current that flows through the whole chip is increased, so that the size of the chip can be reduced.

Second Embodiment

<Configuration>

Figure 9:
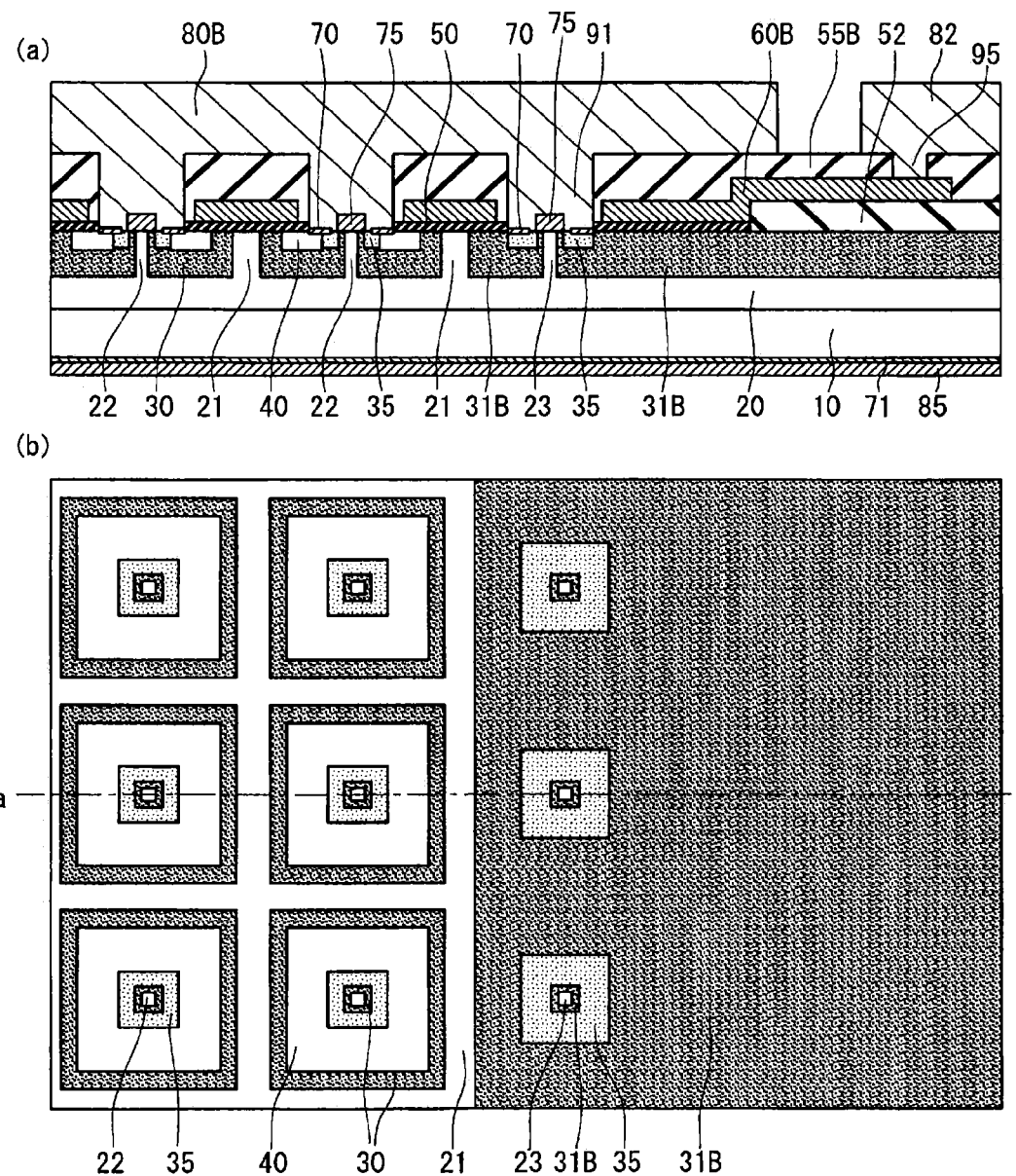
FIG. 9 is a schematic cross-sectional view and a schematic plan view of a semiconductor device according to a second embodiment.

Part (a) of FIG. 9 is a diagram for describing a structure of a portion of a termination of an active region and is a schematic cross-sectional view corresponding to a position of a-a' in FIG. 3, the portion being adjacent to a gate electrode 82. Part (b) of FIG. 9 is a schematic plan view of the portion of part (a) of FIG. 9. FIG. 9 only shows a semiconductor region and does not show an electrode, an insulating film, and the like.

Figure 10:
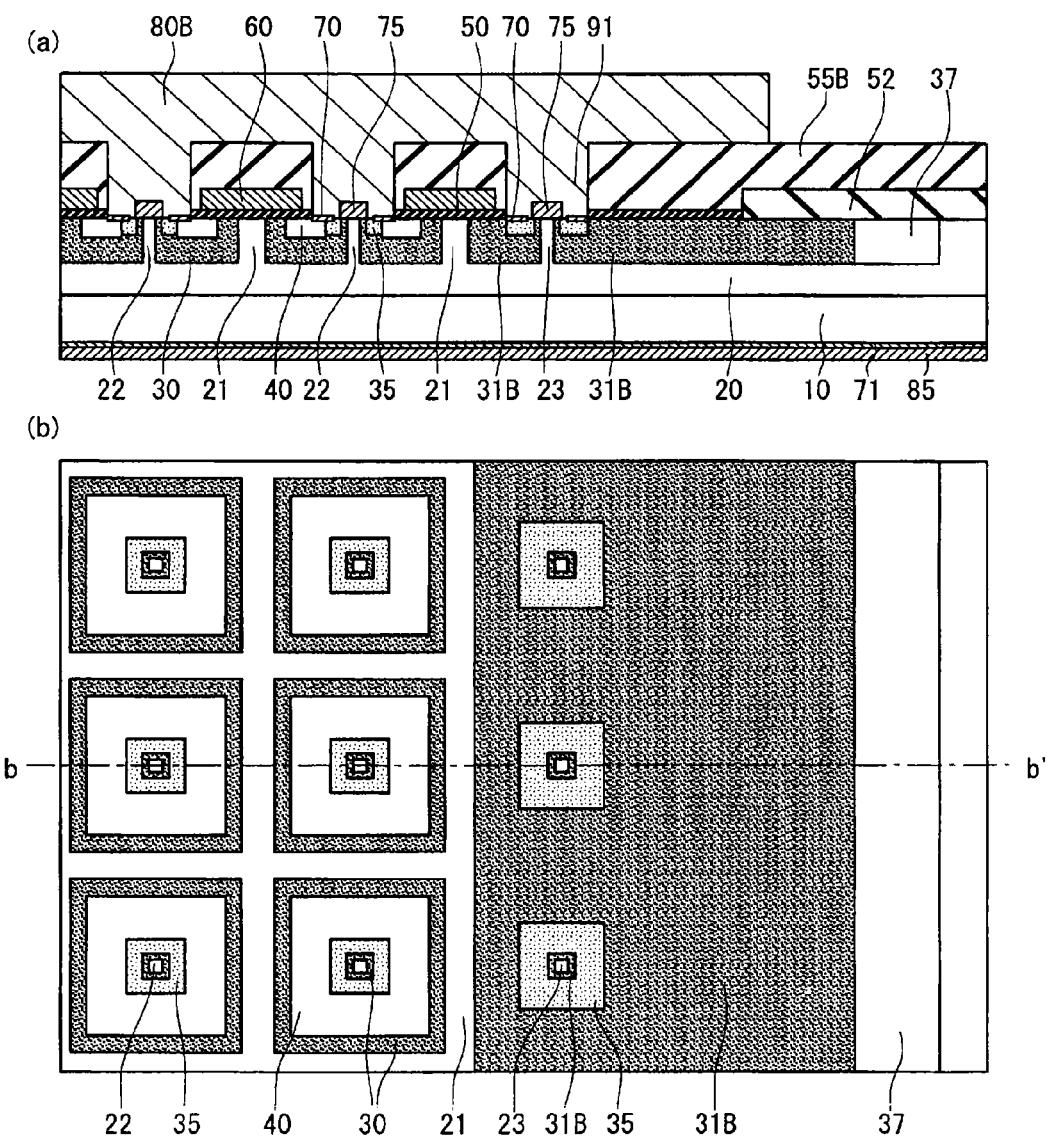
FIG. 10 is a schematic cross-sectional view and a schematic plan view of the semiconductor device according to the second embodiment.

Part (a) of FIG. 10 is a diagram for describing a structure of a portion of the termination of the active region and is a schematic cross-sectional view corresponding to a position of b-b' in FIG. 3, the portion being adjacent to a termination of a chip without the gate electrode 82. Part (b) of FIG. 10 is a schematic plan view of the portion of part (a) of FIG. 10. Part (b) of FIG. 10 only shows a semiconductor region and does not show an electrode, an insulating film, and the like.

This embodiment has a configuration below that does not include the Schottky electrode 75 being the lower portion of the SBD contact hole 92 and the third separation region 23 being the lower portion of the SBD contact hole 92, as described in the first embodiment.

In a plan region of a well contact hole 91, both of a first well contact region 35 and a third separation region 23 are formed, and a Schottky electrode 75 in contact with at least part of the surface of the third separation region 23 and an ohmic electrode 70 that is in contact with at least part of the surface of the first well contact region 35 and is positioned to sandwich the Schottky electrode 75 therein in plan view are formed. The Schottky electrode 75 and the ohmic electrode 70 are in contact with a source electrode 80B through the well contact hole 91.

A gate electrode 60B covering a gate insulating film 50 and an interlayer insulating film 55B further covering the gate electrode 60B are provided on a periphery side of the well contact hole 91.

The manufacturing method is almost the same as that in the first embodiment, and positions for implantation in a wide well region 31B and in the first well contact region 35 only need to be modified, and a mask layout only needs to be modified to dispose the ohmic electrode 70 and the Schottky electrode 75 in desired positions.

<Effects>

This embodiment has the effects of suppressing the operation of the p-n diode formed between the wide well region 31B and the drift layer 20 and reducing the amount of holes implanted in the drift layer 20 in the active region adjacent to the wide well region 31B, similarly to the first embodiment. Thus, occurrence of crystal defects in the drift layer 20 in the active region can be suppressed.

As compared to the first embodiment, the SBD contact hole 92 can be omitted, so that the chip can be shrunk, and the advantage of reducing cost can be obtained.

In this embodiment, the differences between the first embodiment and this embodiment are described, and descriptions of the same or corresponding portions are omitted.

Third Embodiment

<Configuration>

Figure 11:
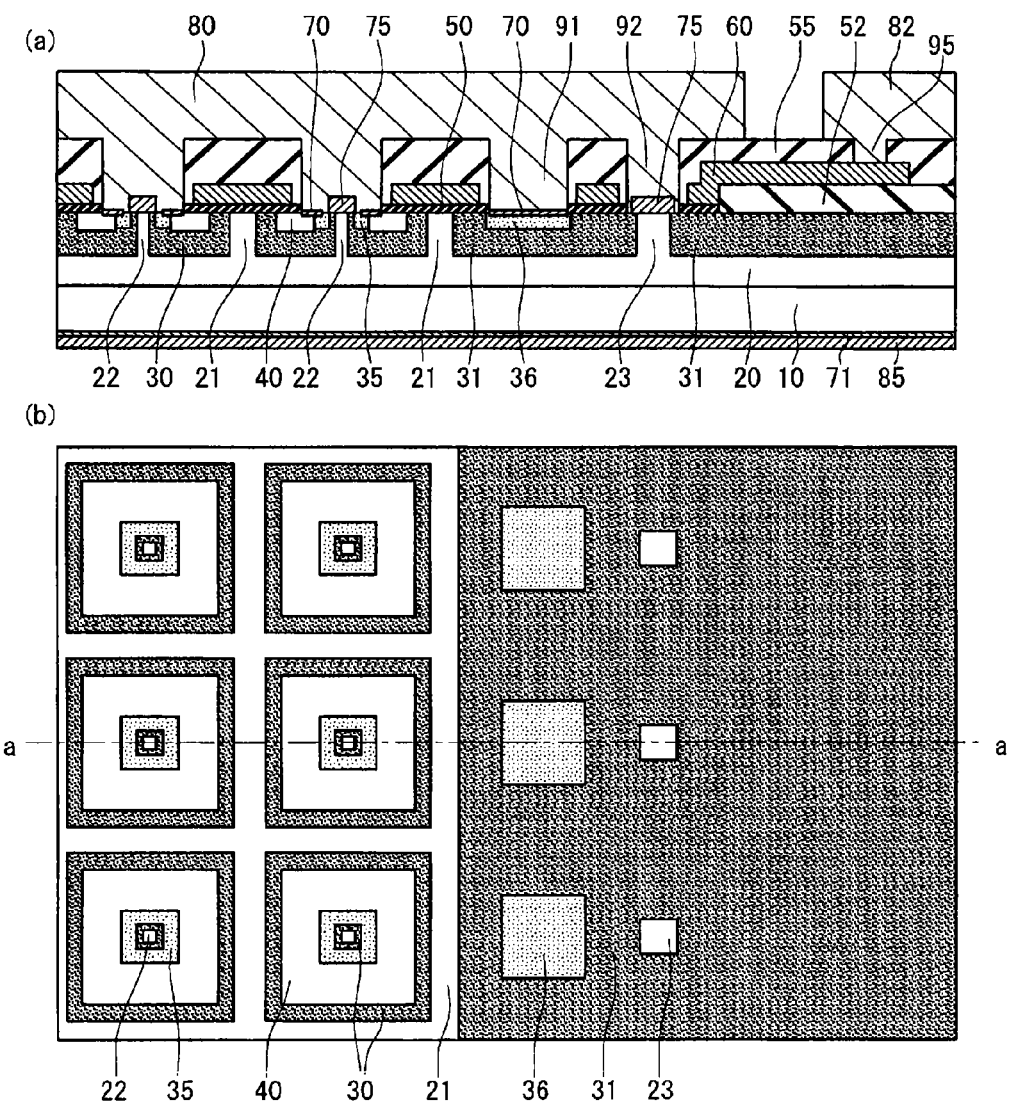
FIG. 11 is a schematic cross-sectional view and a schematic plan view of a semiconductor device according to a third embodiment.

Part (a) of FIG. 11 is a diagram for describing a structure of a portion of a termination of an active region and is a schematic cross-sectional view corresponding to a position of a-a' in FIG. 3, the portion being adjacent to a gate electrode 82. Part (b) of FIG. 11 is a schematic plan view of the portion of part (a) of FIG. 11. Part (b) of FIG. 11 only shows a semiconductor region and does not show an electrode, an insulating film, and the like.

Figure 12:
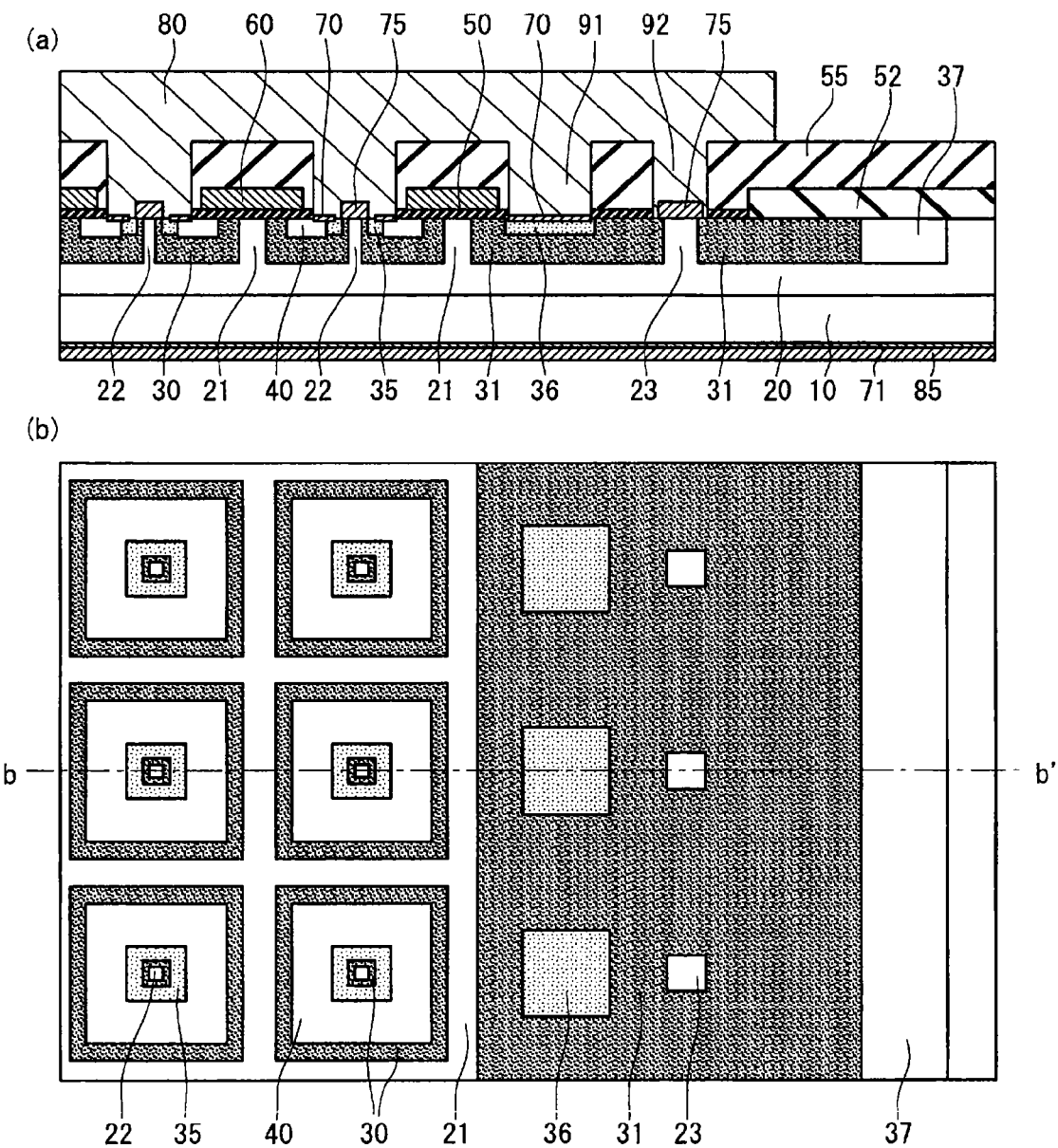
FIG. 12 is a schematic cross-sectional view and a schematic plan view of the semiconductor device according to the third embodiment.

Part (a) of FIG. 12 is a diagram for describing a structure of a portion of the termination of the active region and is a schematic cross-sectional view corresponding to a position of b-b' in FIG. 3, the portion being adjacent to a termination of a chip without the gate electrode 82. Part (b) of FIG. 12 is a schematic plan view of the portion of part (a) of FIG. 12. Part (b) of FIG. 12 only shows a semiconductor region and does not show an electrode, an insulating film, and the like.

Instead of the first well contact region 35 disposed in part of the wide well region 31 in the first embodiment, a second well contact region 36 at a p-type impurity concentration lower than the impurity concentration of the first well contact region 35 is formed in the structure shown in this embodiment.

The manufacturing method is almost the same as that in the first embodiment. The first well contact region 35 disposed in part of the wide well region 31 needs to be eliminated, the same process of forming the first well contact region 35 needs to be repeated to form the second well contact region 36 instead, and a dosage upon an implantation of an impurity needs to be reduced to a desired amount.

<Effects>

This embodiment has the effects of reducing the forward voltage applied to the p-n junction formed between the wide well region 31 and the drift layer 20 by the unipolar current flowing from the SBD formed while the wide well region 31 is partially lost, similarly to the first embodiment. Upon the operation of the p-n diode, the current flows through the path formed of the metal layer and the semiconductor layer between the ohmic electrode 70 and the second well contact region 36, and the contact resistance between the metal layer and the semiconductor layer is increased with the increase in the voltage drop in this portion, to thereby further reduce the current flowing through the p-n diode, the ohmic electrode 70 being disposed in the wide well region 31 on the periphery side.

As a result, the diffusion of the holes in the drift layer 20 of the unit cells adjacent to the wide well region 31 is reduced, and thus occurrence of crystal defects in the drift layer 20 in the active region can be suppressed.

In this embodiment, the differences between the first embodiment and this embodiment are described, and descriptions of the same or corresponding portions are omitted.

Fourth Embodiment

<Configuration>

Figure 13:
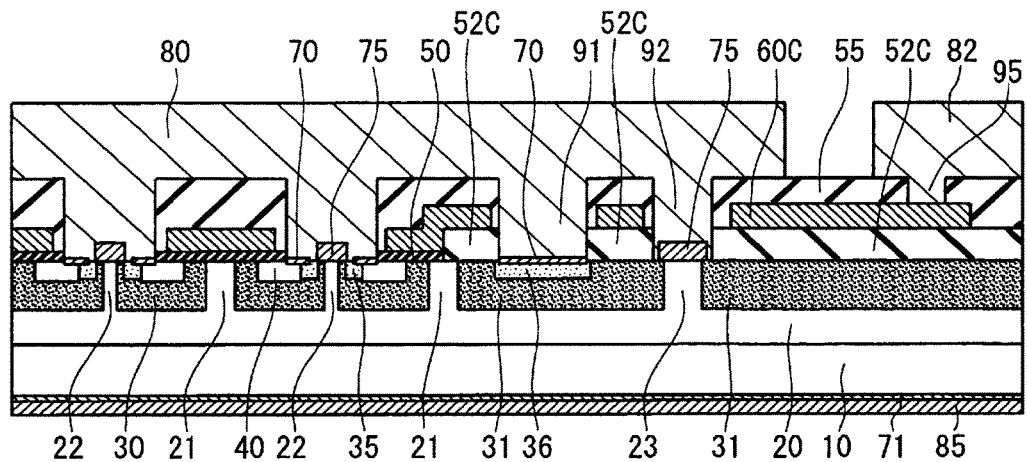
FIG. 13 is a schematic cross-sectional view of a semiconductor device according to a fourth embodiment.

FIG. 13 is a diagram for describing a structure of a portion of a termination of an active region and is a schematic cross-sectional view corresponding to a position of a-a' in FIG. 3, the portion being adjacent to a gate electrode 82.

In the structure shown in this embodiment unlike the third embodiment, a field insulating film 52C extends to the active region side to cover most part of a wide well region 31. A well contact hole 91 and a SBD contact hole 92 are formed to penetrate not only an interlayer insulating film 55 but also the field insulating film 52C. A gate electrode 60C also remains to be formed on the field insulating film 52C.

The manufacturing method is almost the same as that in the third embodiment, and a mask layout only needs to be modified such that the plan position of the field insulating film 52C is desirable. The field insulating film 52C in positions corresponding to the well contact hole 91 and the SBD contact hole 92 is preferably etched simultaneously when the other part of the field insulating film 52C is etched. Thus, a thickness that needs to be etched for subsequently forming the well contact hole 91 and the SBD contact hole 92 is equal to thicknesses of the other portions that need to be etched for simultaneously forming contact holes, thereby facilitating the process.

<Effects>

In this embodiment, the field insulating film 52C serving as a first insulating film located on the wide well region 31 has a thickness greater than a thickness of a gate insulating film 50 as the first insulating film located on the well regions 30.

This embodiment has the effects of reducing the electric field strength applied to an oxidation film on the wide well region 31. As shown in the third embodiment, to reduce the forward current in the p-n diode formed by the contact between the wide well region 31 and the drift layer 20, it is effective to increase the contact resistance between the second well contact region 36 disposed in the wide well region 31 and the ohmic electrode 70.

However, the increased contact resistance between the second well contact region 36 disposed in the wide well region 31 and the ohmic electrode 70 easily generates large voltage in the wide well region 31. For example, while the element is shifted from the ON state to the OFF state, the reverse bias applied to the p-n junction formed between the well regions 30 or the wide well region 31 and the drift layer 20 is temporarily increased with the increase in the drain voltage, and widths of the depletion layers formed in the well regions 30, the wide well region 31, and the drift layer 20 are temporarily increased. At this time, the holes are emitted from the well regions 30 and the wide well region 31 with the increase in the widths of the depletion layers, and the holes are discharged into the source electrode 80 grounded with 0 volt through the nearest junction between the second well contact region 36 and the ohmic electrode 70. Many holes are emitted from the wide well region 31 particularly having the large area, so that a hole current in a high density of current flows through the junction between the second well contact region 36 partially formed in the wide well region 31 and the ohmic electrode 70. For the large contact resistance in this portion, the voltage drop in proportion to a product of the hole current and the contact resistance occurs, and a potential of the wide well region 31 increases. The voltage occurring at this time may be up to several hundreds of volts depending on the contact resistance and switching speed and may be much larger than a potential of the gate electrode 60C with substantial 0 volt.

At this time, in the structure shown in the third embodiment, the gate insulating film 50 having a thin thickness is formed in most part between the wide well region 31 and the gate electrode 60, so that a high electric field exceeding a dielectric breakdown electric field may be applied to the gate insulating film 50.

On the other hand, in the structure shown in this embodiment, the field insulating film 52C having a thick thickness is formed between the wide well region 31 and the gate electrode 60C, so that electric field strength being applied can be suppressed to low. This embodiment reduces the problems in which crystal defects occur in the active region adjacent to the wide well region 31 and reduces the problems in which dielectric breakdown occurs in the oxidation film on the wide well region 31, and thus this embodiment can obtain the semiconductor device with higher reliability.

In this embodiment, the differences between the first embodiment and this embodiment are described, and descriptions of the same or corresponding portions are omitted.

Fifth Embodiment

<Configuration>

In this embodiment, an example of applying the technology of the first embodiment to a MOSFET with a built-in SBD having a built-in current sense.

Figure 14:
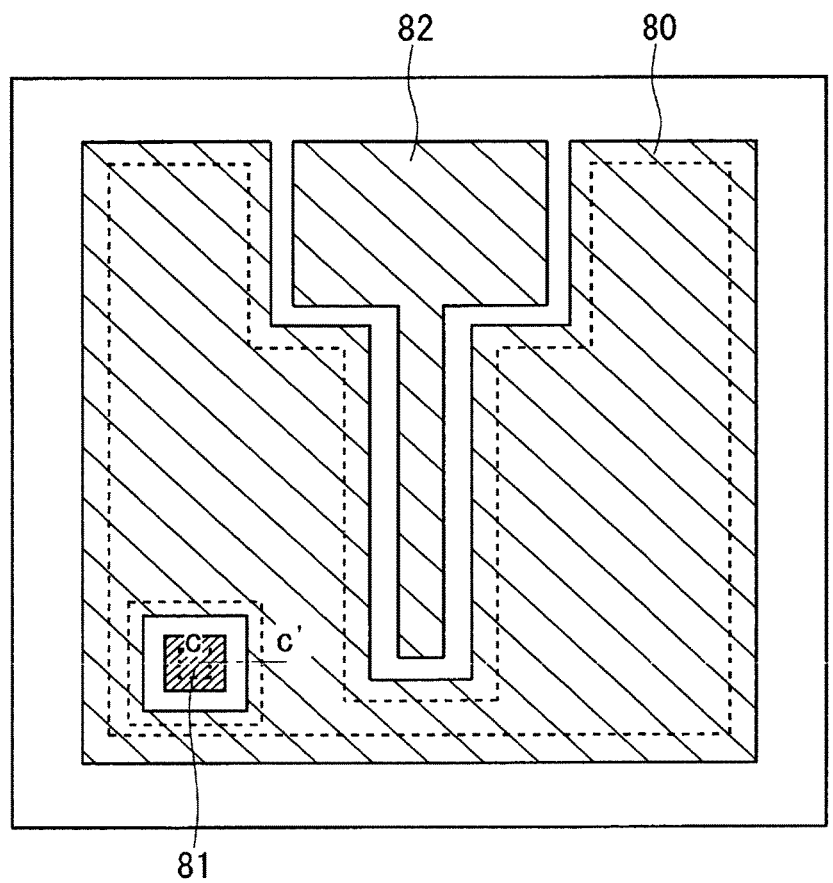
FIG. 14 is a schematic plan view schematically showing the whole semiconductor device having a built-in current sense.

First, a structure and functions of the current sense are described. FIG. 14 is a diagram seen from above the MOSFET with the built-in SBD having the built-in current sense, namely, a diagram seen from a first main surface side, showing a plan position of an active region by broken lines.

In the MOSFET with the built-in SBD having the built-in current sense, a source electrode 80 and a sense electrode 81 (second source electrode) separated from the source electrode 80 in plan view are formed on the first main surface. The active region formed of an arrangement of unit cells is formed in part of the sense electrode 81, the arrangement being the same layout formed in part of the source electrode 80. A cross-sectional view of each of the unit cells is similar to that of the unit cell in the lower portion of the source electrode 80 shown in FIG. 2, and it may be considered that the source electrode 80 is replaced with the sense electrode 81.

Hereinafter, the unit cells included in the active region in the lower portion of the source electrode 80 are referred to as main cells, and the unit cells included in the active region in the lower portion of the sense electrode 81 are referred to as sense cells. A gate electrode 60 and a drain electrode 85 in the main cells are electrically short-circuited to the corresponding electrodes in the sense cells and are at the same potential. Moreover, the sense electrode 81 and the source electrode 80 are operated with almost the same substantial 0 volt.

Thus, it is conceivable that the same current always flows through the one sense cell and the one main cell. The number of sense cells is significantly lower than the number of main cells, such as one ten-thousandth. The current flowing through the unit cells in the low number is measured through a shunt resistor or the like, and the current value is multiplied by a ratio of the number of cells, so that the current flowing through the source electrode can be estimated. Particularly in an ON state, when an overcurrent flows through the element, the overcurrent is detected and an OFF signal is applied to a gate electrode 82 to prevent the element from being thermally destroyed. This is the advantage of the built-in current sense.

Figure 15:
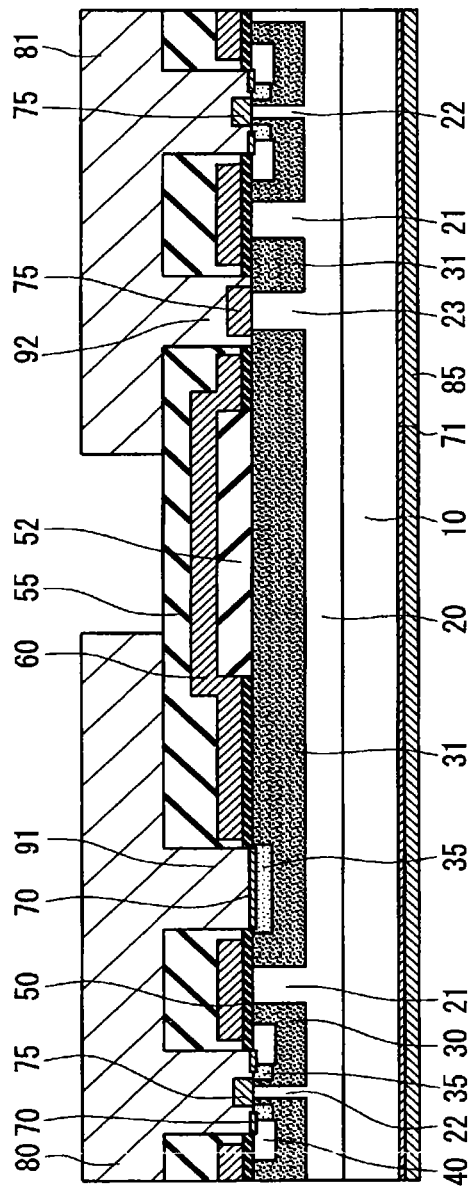
FIG. 15 is a schematic cross-sectional view of a semiconductor device according to a fifth embodiment.
Figure 16:
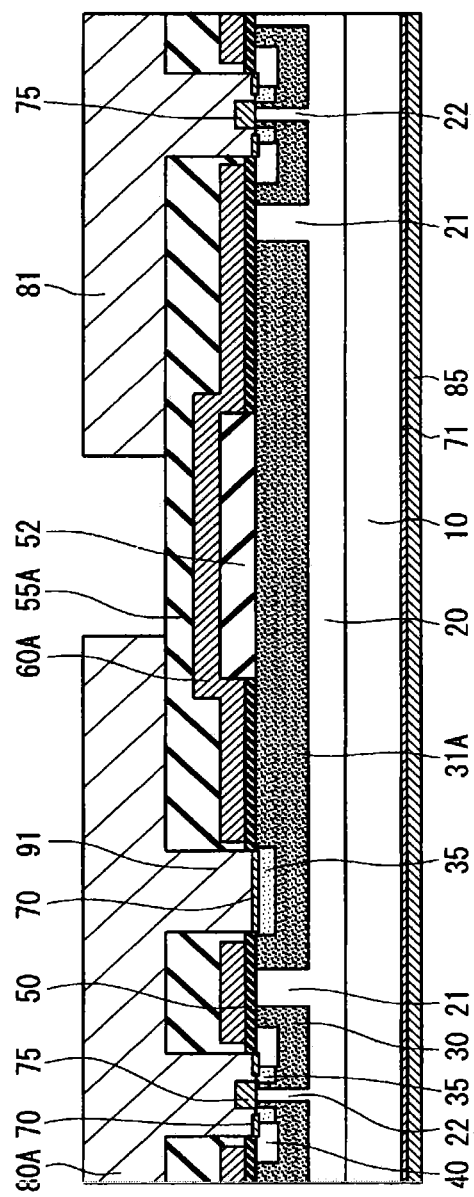
FIG. 16 is a schematic cross-sectional view of the semiconductor device according to the fifth embodiment.

FIG. 15 is a schematic cross-sectional view from an end portion of the arrangement of the main cells to an end portion of the arrangement of the sense cells, and FIG. 16 is a schematic cross-sectional view in a case where the present invention is not used. In both cases, they are schematic cross-sectional views corresponding to a portion of c-c' in FIG. 14.

In a region sandwiched between the two active regions, the gate electrode 60 (gate electrode 60A) is formed so as to connect the two active regions, and a gate insulating film 50 or a field insulating film 52 is formed below the gate electrode 60 (gate electrode 60A). As described above, the structure of the present invention can prevent the application of a high electric field to the gate insulating film 50 and the field insulating film 52 in the OFF state.

In the structure of this embodiment, a third separation region 23 is formed as a partially lost portion close to the sense cell in a wide well region 31, and a Schottky electrode 75 is formed to be in contact with at least part of the third separation region 23. The Schottky electrode 75 is connected with a sense electrode 81 through a SBD contact hole 92 penetrating the interlayer insulating film 55 and the gate insulating film 50. In the structure shown in FIG. 16 without using the present invention, a wide well region 31A is formed without a loss, and a SBD contact hole 92 is not formed, so that an interlayer insulating film 55A and the gate electrode 60A are formed on the portion.

The manufacturing method is almost the same as that in the first embodiment, and each mask layout only needs to be modified. The sense electrode 81, the source electrode 80, and the gate electrode 82 can be simultaneously formed, that is to say, they can be formed by one deposition of a metal material and by patterning and etching using a photoresist.

<Effects>

This configuration has the effects of effectively suppressing occurrence of crystal defects due to the p-n current in the sense cells. This effect is achieved by forming the SBD diode while the wide well region 31 close to the sense cells is partially lost and by connecting the Schottky electrode 75 to the sense electrode 81 instead of the source electrode 80 to dispose the SBD diode closer to the sense cells.

It can be described that it is effective to dispose the SBD diode in the position closer to the sense cells, resulting from the mechanism to reduce the forward voltage applied to the p-n diode close to the SBD diode by the unipolar current that flows from the SBD diode disposed on part of the wide well region 31 and causes the voltage drop in the drift layer 20 and in the substrate 10 directly below the SBD diode and close to the SBD diode, as described above.

The occurrence of the crystal defects in the current sense is particularly deleterious to the occurrence of the crystal defects in the main cells. The reason is that the number of cells for the current sense is significantly lower than the number of main cells and that a change in resistance in the whole active region is greater in the current sense even if the crystal defects occur in the same area. The current flowing through the source electrode 80 fails to be properly estimated due to the change in resistance in the current sense, and an OFF signal fails to be properly transmitted to the gate electrode 60 upon a flow of overcurrent, thereby increasing the risk of breaking the element.

This embodiment can provide the semiconductor device with higher reliability that suppresses a change in an ON resistance in the sense cells.

The descriptions above include the point that the occurrence of the crystal defects is suppressed in the sense cells. However, it is important to suppress occurrence of crystal defects also in the main cells.

Figure 17:
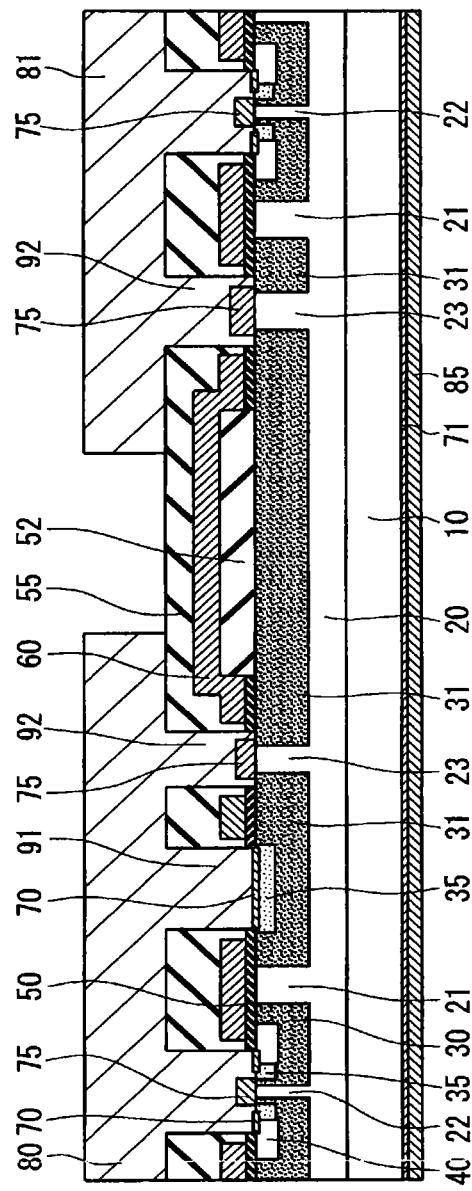
FIG. 17 is a schematic cross-sectional view of the semiconductor device according to the fifth embodiment.

FIG. 17 is a schematic cross-sectional view corresponding to the portion of c-c' in FIG. 14. As shown in FIG. 17, it is effective that SBD diodes are formed, on the wide well region 31, both close to the main cells and close to the sense cells and are connected with the source electrode 80 and the sense electrode 81, respectively.

In this embodiment, the differences between the first embodiment and this embodiment are described, and descriptions of the same or corresponding portions are omitted.

Sixth Embodiment

<Configuration>

Figure 18:
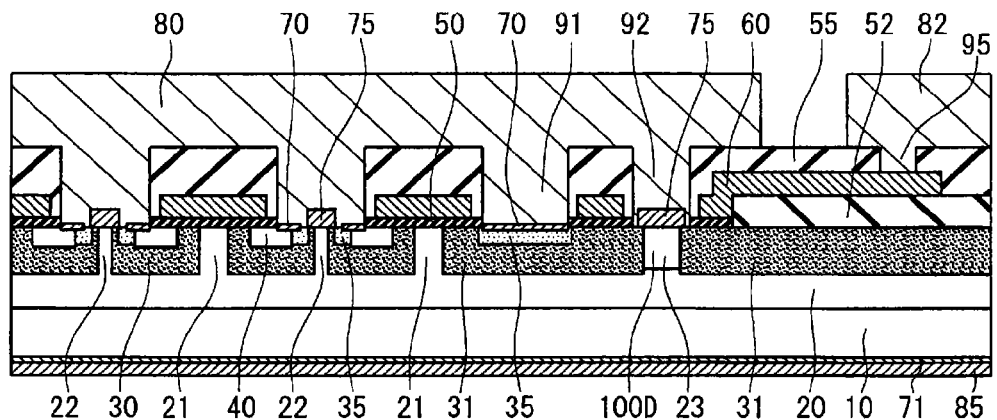
FIG. 18 is a schematic cross-sectional view of a semiconductor device according to a sixth embodiment.

FIG. 18 is a diagram for describing a structure of a portion of a termination of an active region and is a schematic cross-sectional view corresponding to a position of a-a' in FIG. 3, the portion being adjacent to a gate electrode 82.

In the SBD diode formed while the wide well region 31 is partially lost in the first embodiment, an n-type concentration in a third separation region 23 directly below the SBD diode is higher than an n-type concentration in a drift layer 20 (the region is a high-concentration region 100D) in the structure shown in this embodiment.

A process of ion-implanting an n-type dopant such as an N ion after patterning with a photoresist to implant ions in only a desired portion needs to be added to the manufacturing method, the process being similar to the ion implantation in a source region 40 or the like. The implantation range is a region including the third separation region 23 whose n-type concentration needs to be increased, and an implantation concentration is lower than a p-type concentration in well regions 30 and the wide well region 31 at the same depth, allowing for an increase in the n-type concentration in the third separation region 23.

<Effects>

This configuration has the effects similar to those in the first embodiment, and it can be said that the effects of this configuration are more remarkable than those in the first embodiment. This results from that the n-type concentration of the third separation region 23 formed in part of the wide well region 31 is increased to form the high-concentration region 100D and that the resistance in the third separation region 23 being the conduction path through which the unipolar current flows from the SBD is reduced to pass more unipolar current.

This increases the voltage drop in the drift layer 20 and the substrate 10 around the SBD, which more remarkably reduces the voltage applied to the adjacent p-n junction.

Figure 19:
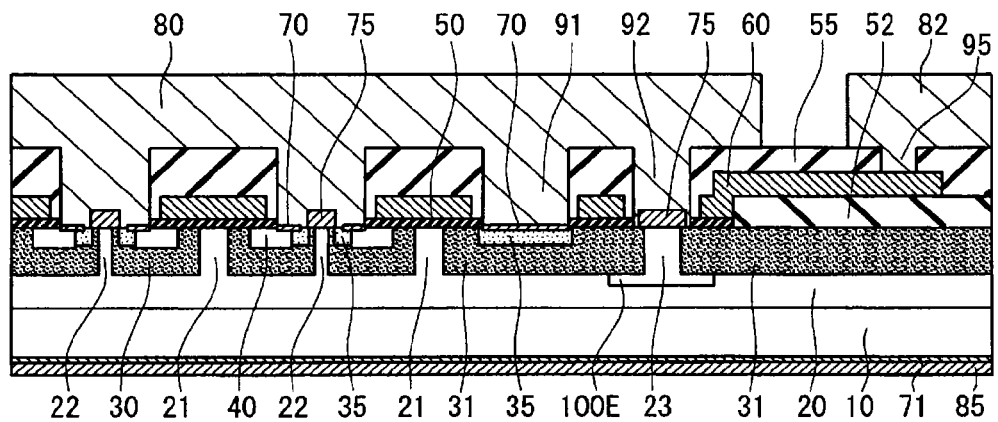
FIG. 19 is a schematic cross-sectional view of the semiconductor device according to the sixth embodiment.

As shown in a schematic cross-sectional view of the same portion in FIG. 19, the n-type region at the high concentration has a depth deeper than that of the wide well region 31 to form a high-concentration region 100E extending to a position 0.05 to 1.0 [μm] deeper than the wide well region 31, so that the unipolar current flowing through the third separation region 23 spreads wider in the drift layer 20 in a planar direction. Thus, the effect of reducing also the resistance in the drift layer 20 can be obtained.

Figure 20:
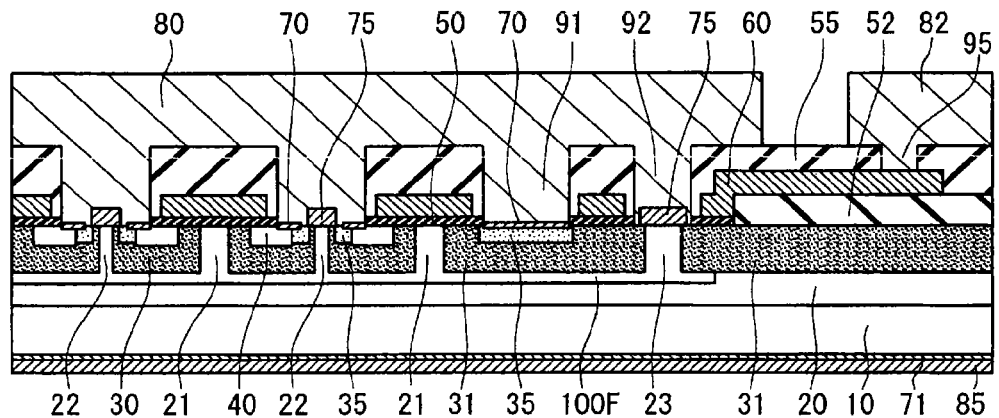
FIG. 20 is a schematic cross-sectional view of the semiconductor device according to the sixth embodiment.

As shown in a schematic cross-sectional view of the same portion in FIG. 20, a high-concentration region 100F extended in the whole chip instead of only the third separation region 23 is formed so as to simultaneously increase n-type concentrations in a first separation region 22 and a second separation region 21 in the active region. Thus, the unipolar current flowing through the whole chip during dead time can be increased. A resistance in a path through which an ON current flows in an ON state is reduced, so that the effect of reducing the ON resistance can be obtained. The n-type ion implantation is performed in the region including the active region to increase the concentration in the third separation region 23 formed in part of the wide well region 31, so that the effects described above can be achieved all at once without increasing the number of processes.

In this embodiment, the differences between the first embodiment and this embodiment are described, and descriptions of the same or corresponding portions are omitted. It is described with reference to only the portion corresponding to the position of a-a' in FIG. 3, and needless to say, this embodiment is also applicable to the portions corresponding to the position of b-b' in FIG. 3 and the position of c-c' in FIG. 14.

Moreover, this embodiment is applicable in a case where both of the first well contact region 35 and the third separation region 23 are formed in the well contact hole 91, and the Schottky electrode 75 on the surface of the third separation region 23 and the ohmic electrode 70 positioned to sandwich the Schottky electrode 75 therein in plan view are formed, as shown in FIGS. 9 and 10.

Seventh Embodiment

<Configuration>

Figure 21:
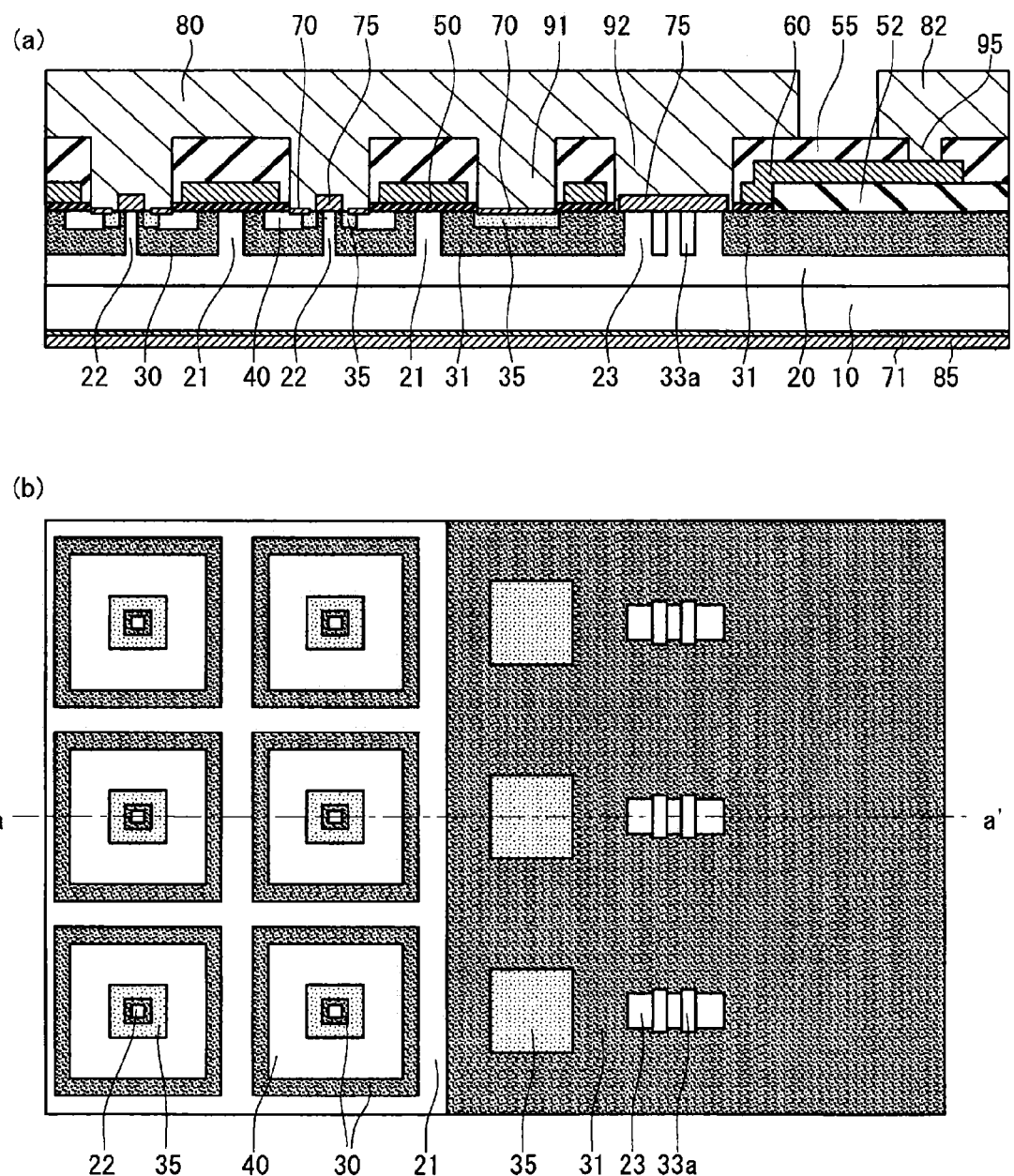
FIG. 21 is a schematic cross-sectional view of a semiconductor device according to a seventh embodiment.

Part (a) of FIG. 21 is a diagram for describing a structure of a portion of a termination of an active region and is a schematic cross-sectional view corresponding to a position of a-a' in FIG. 3, the portion being adjacent to a gate electrode 82. Part (b) of FIG. 21 is a schematic plan view of the portion of part (a) of FIG. 21. Part (b) of FIG. 21 only shows a semiconductor region and does not show an electrode, an insulating film, and the like.

The structure shown in the diagram includes an auxiliary region 33a of a p-type that is in contact with a Schottky electrode 75 in a SBD diode formed in a partially lost portion on the wide well region 31 and that is partially formed in a third separation region 23. Specifically, the auxiliary region 33a is a junction barrier Controlled Schottky diode (JBS) formed so as to separate the third separation region 23 in a planar direction as seen from a certain cross-sectional direction (so as to divide the third separation region 23 in a direction away from well regions 30).

FIG. 22 is a diagram for describing a structure of the portion of the termination of the active region and is a schematic cross-sectional view corresponding to the position of a-a' in FIG. 3, the portion being adjacent to the gate electrode 82. The diagram only shows a semiconductor region and does not show an electrode, an insulating film, and the like.

The structure shown in the diagram includes an auxiliary region 33b of a p-type that is in contact with the Schottky electrode 75 in the SBD diode formed in a partially lost portion on the wide well region 31 and that is partially formed in the third separation region 23. Specifically, the auxiliary region 33b is formed so as to separate the third separation region 23 in the planar direction as seen from a certain cross-sectional direction (so as to divide the third separation region 23 along the edge of the active region).

FIG. 23 is a diagram for describing a structure of the portion of the termination of the active region and is a schematic cross-sectional view corresponding to the position of a-a' in FIG. 3, the portion being adjacent to the gate electrode 82. The diagram only shows a semiconductor region and does not show an electrode, an insulating film, and the like.

The structure shown in the diagram includes an auxiliary region 33c of a p-type that is in contact with the Schottky electrode 75 in the SBD diode formed in a partially lost portion on the wide well region 31 and that is partially formed in the third separation region 23. Specifically, the auxiliary region 33c is formed so as to (partially) separate the third separation region 23 in the planar direction as seen from a certain cross-sectional direction (so as to divide the third separation region 23 along the edge of the active region and in the direction away from the well regions 30).

<Effects>

This configuration increases the unipolar current flowing from the SBD diode formed in part of the wide well region 31 and can suppress the occurrence of crystal defects in the adjacent active region. The SBD current flows at the maximum for the purpose of increasing the effects.

Meanwhile, when the width of the third separation region 23 is increased, the effect that the depletion layer spreading from the wide well region 31 in the OFF state reduces the electric field strength applied to the interface of the SBD is reduced, to thereby prevent a leak current from increasing. The reason is that the depletion layer extending from the auxiliary region of the p-type reduces the electric field strength applied to the interface of the SBD in the OFF state.

A process of ion-implanting a p-type dopant such as a Al ion after patterning with a photoresist to implant ions in only a desired portion needs to be added to the manufacturing method in addition to that in the first embodiment, the process being similar to the ion implantation in the well regions 30, the wide well region 31, or the like. The concentration at this time is desired to be higher than the concentration in the third separation region 23 to sufficiently extend the depletion layer from the auxiliary region to the third separation region 23, and an extremely high dosage is not desired to prevent a rough surface of silicon carbide being the interface of the SBD. Specifically, it is preferably $1\times10^{16}$ [cm$^{-3}$] or more and $1\times10^{21}$ [cm$^{-3}$] or less.

As contrivance to prevent an increase in the number of processes, the implantation for forming the well regions 30 and the wide well region 31 may be applied for forming the auxiliary region.

In this embodiment, the differences between the first embodiment and this embodiment are described, and descriptions of the same or corresponding portions are omitted. It is described with reference to only the portion corresponding to the position of a-a' in FIG. 3, and needless to say, this embodiment is also applicable to the portions corresponding to the position of b-b' in FIG. 3 and the position of c-c' in FIG. 14.

Moreover, this embodiment is applicable in a case where both of the first well contact region 35 and the third separation region 23 are formed in the well contact hole 91, and the Schottky electrode 75 on the surface of the third separation region 23 and the ohmic electrode 70 positioned so as to sandwich the Schottky electrode 75 therein in plan view are formed, as shown in FIGS. 9 and 10.

Eighth Embodiment

<Configuration>

FIG. 25 is a diagram for describing a structure of a portion of the termination of an active region and is a schematic cross-sectional view corresponding to a position of a-a' in FIG. 3, the portion being adjacent to a gate electrode 82. FIG. 25 only shows a semiconductor region and does not show an electrode, an insulating film, and the like. Similarly, FIG. 26 is a diagram for describing a structure of a portion of the termination of the active region and is a schematic cross-sectional view corresponding to a position of b-b' in FIG. 3, the portion being adjacent to a termination of a chip without the gate electrode 82.

In the stricture shown in this embodiment, in the SBD diode formed while the wide well region 31 is partially lost in the first embodiment, a shape of a third separation region 23a has a dimension in a direction (X direction) parallel to a direction toward the closest active region larger than a dimension in a direction (Y direction) perpendicular to the direction toward the closest active region. In other words, the dimension of the third separation region 23a in a direction in which the wide well region 31 sandwiches well regions 30 therein is larger than the dimension of the third separation region 23a in a direction perpendicular to the direction in which the wide well region 31 sandwiches the well regions 30 therein.

<Effects>

This configuration has the two effects. One of the effects is similar to that in the first embodiment, and it can be said that the effect of this configuration is more remarkable than that in the first embodiment. This results from that the shape of the third separation region 23a has the dimension larger in the X direction, increasing the area of the third separation region 23a and passing more unipolar current. The other effect prevents the disadvantage occurring when the Y direction is increased to increase the area of the third separation region 23a.

The disadvantage is that, in the portion adjacent to the gate electrode 82 shown in FIG. 25, the gate electrode 60 is partially narrow by increasing the lost dimension in the Y direction among the lost region of the gate electrode 60 formed so as not to overlap the third separation region 23a and the SBD contact hole 92. For this reason, a resistance to gate current passing in the X direction between the gate contact hole 95 and the active region upon switching, namely, an inner gate resistance increases, resulting in an increase in the switching loss. In the portion adjacent to the termination of the chip without the gate electrode 82 among the termination of the active region shown in FIG. 26, increasing a resistance to displacement current passing in the X direction between the p-n junction surface and the well contact hole 91 reduces a switching speed, thereby increasing the switching loss, the p-n junction being formed of the junction between the wide well region 31 and the drift layer 20.

The wide well region has the dimension larger in the X direction than in the Y direction, so that the disadvantage of increasing the switching loss described above is prevented while more unipolar current can be passed.

<Modifications>

The embodiments above use nitrogen as the n-type (first conductivity type) impurity, which may be phosphorus or arsenic.

The embodiments above use aluminum as the p-type (second conductivity type) impurity, which may be boron or gallium.

The embodiments above give descriptions using particular examples of, for example, the crystal structure, the plane direction of the main surface, the off-angle, and each implantation condition, but the applicability is not limited to a range of these numerical values.

The embodiments above describe that the semiconductor element including silicon carbide is particularly effective, but the other wide gap semiconductor elements are also effective, and a semiconductor element including silicon also have constant effects.

In the embodiments above, the first well contact region 35 (or the second well contact region 36) is formed in the portion in contact with the ohmic electrode 70 in the wide well region 31, but the first well contact region 35 (or the second well contact region 36) may not be formed.

Figure 24:
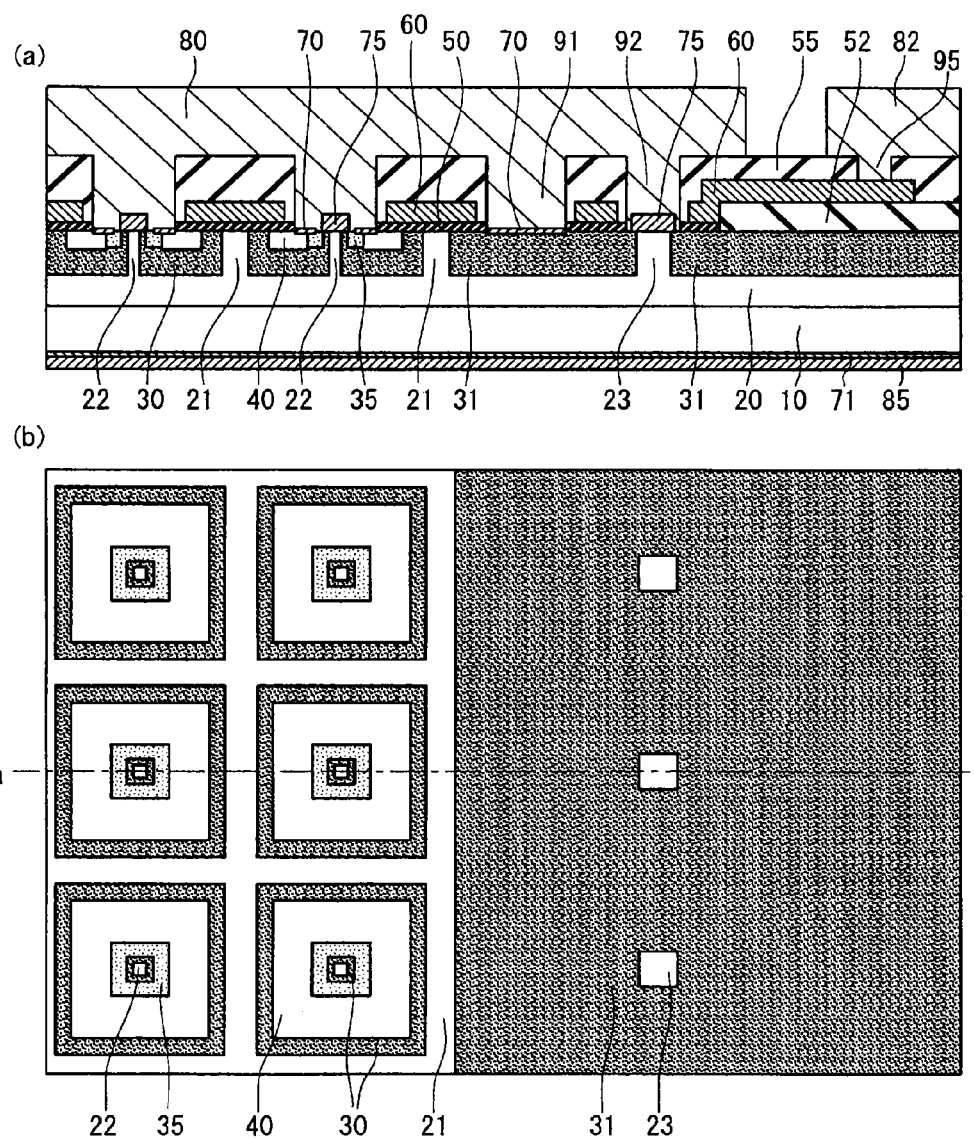
FIG. 24 is a schematic cross-sectional view of a semiconductor device according to a modification.

In other words, as the structure shown in parts (a) and (b) of FIG. 24, the first well contact region 35 (or the second well contact region 36) may not be formed in the surface layer, and the structure may include the wide well region 31 in direct contact with the ohmic electrode 70.

The embodiments above describe the case in which the n-channel MOSFET is used, but it may be a p-channel MOSFET in which a first conductivity type is the p-type and a second conductivity type is the n-type.

The present invention may also be used for a MOSFET having a super junction structure.

The embodiments above use silicon carbide for the gate insulating film 50, which may be a deposition film by a CVD.

The embodiments above describe the so-called vertical MOSFET including the drain electrode 85 formed on the back surface of the substrate 10, but the embodiments may also be used for a so-called lateral MOSFET such as a RESURF MOSFET including the drain electrode 85 formed on the surface of the drift layer 20.

The embodiments above describe the MOSFET including the gate insulating film 50, but the present invention is applicable to a unipolar device, and the present invention may also be used for a junction field effect transistor (HET) or a metal-semiconductor field effect transistor (MESFET) without the gate insulating film 50, for example.

In the embodiments above, the ohmic electrode 70 on the source side and the Schottky electrode 75 are manufactured separately, but they may be continuously formed of the same material and may be continuously formed of different materials.

The embodiments above describe that the unit structure has the rectangular cell shape as the example shown in FIG. 2, but the unit structure may be a hexagon, and furthermore, the unit structure may be a stripe shape such that the cross-sectional structure in FIG. 1, for example, continues in the depth direction.

The semiconductor device described in the embodiments above may be used for power, electric railroads, automobiles, household electrical appliances, solar cells, and communication.

Although the materials of the respective components, the conditions of implementation, and the like, are described in the embodiments of the present invention, the forgoing description is illustrative and not restrictive.

In addition, according to the present invention, the above preferred embodiments can be arbitrarily combined, or each preferred embodiment can be appropriately varied or omitted within the scope of the invention.

DESCRIPTION OF NUMERALS 10 substrate; 20 drift layer; 21 second separation region; 22 first separation region; 23, 23a third separation region; 30 well region; 31, 31A, 31B wide well region; 33a, 33b, 33c auxiliary region; 35 first well contact region; 36 second well contact region; 37 JTE region; 40 source region; 50 gate insulating film; 52, 52C field insulating film; 55, 55A, 55B interlayer insulating film; 60, 60A, 60B, 60C, 82 gate electrode; 70 ohmic electrode; 71 back surface ohmic electrode; 75 Schottky electrode; 80, 80A, 80B source electrode; 81 sense electrode; 85 drain electrode; 91 well contact hole; 92 SBD contact hole; 95 gate contact hole; 100D, 100E, 100F high-concentration region.

The invention claimed is:

1. A semiconductor device, comprising:
a drift layer of a first conductivity type located on a semiconductor substrate of the first conductivity type;
a plurality of first well regions of a second conductivity type provided at an interval in a surface layer of said drift layer;
a second well region of the second conductivity type located in the surface layer of said drift layer while sandwiching the entirety of said plurality of first well regions therein in plan view, said second well region having a formation area larger than that of each of said first well regions;
a first separation region of the first conductivity type located to penetrate each of said first well regions from a surface layer of each of said first well regions in a depth direction;
a source region of the first conductivity type located in the surface layer of each of said first well regions while sandwiching said first separation region therein in plan view;
a first Schottky electrode provided on said first separation region;
a first ohmic electrode provided over each of said first well regions while sandwiching said first Schottky electrode therein in plan view;
a second separation region of the first conductivity type being a region for separating said first well regions from each other;
a third separation region of the first conductivity type located to penetrate said second well region from a surface layer of said second well region in the depth direction;
a second Schottky electrode provided on said third separation region;
a gate electrode provided, through a first insulating film, over said first and second well regions except for positions in which said first and second Schottky electrodes and said first ohmic electrode are provided;
a second insulating film located to cover said gate electrode; and
a first source electrode provided to cover said first and second Schottky electrodes, said first ohmic electrode, and said second insulating film.

2. The semiconductor device according to claim 1, further comprising a second ohmic electrode provided on said second well region in a position adjacent to said first well regions, wherein
said gate electrode is provided also except for a position in which said second ohmic electrode is provided, and
said first source electrode is also provided to cover said second ohmic electrode.

3. The semiconductor device according to claim 2, wherein said third separation region is positioned farther from said first well regions than said second ohmic electrode.

4. The semiconductor device according to claim 2, wherein said second ohmic electrode is positioned so as to sandwich said second Schottky electrode therein in plan view.

5. The semiconductor device according to claim 2, wherein said first insulating film located on said second well region has a thickness greater than a thickness of said first insulating film located on said first well regions.

6. The semiconductor device according to claim 2, wherein a contact resistance in said second ohmic electrode is higher than a contact resistance in said first ohmic electrode.

7. The semiconductor device according to claim 2, further comprising a first well contact region of the second conductivity type located, in the surface layer of each of said first well regions, in a position in which said first ohmic electrode is provided.

8. The semiconductor device according to claim 7, further comprising a second well contact region of the second conductivity type located, in the surface layer of said second well region, in a position in which said second ohmic electrode is provided,
   wherein an impurity concentration in said second well contact region is lower than an impurity concentration in said first well contact region.

9. The semiconductor device according to claim 1, further comprising a second source electrode that covers said first Schottky electrode located on said first separation region in at least one of said plurality of first well regions and covers said first ohmic electrode located over said first well region so as to sandwich said first Schottky electrode therein, said second source electrode being different from said first source electrode.

10. The semiconductor device according to claim 1, further comprising an auxiliary region of the second conductivity type partially located in said third separation region.

11. The semiconductor device according to claim 1, wherein an impurity concentration of the first conductivity type in said third separation region is higher than an impurity concentration of the first conductivity type in said drift layer.

12. The semiconductor device according to claim 1, wherein said drift layer comprises silicon carbide.

13. The semiconductor device according to claim 2, wherein a distance on the surface of said drift layer between a plan position of said second ohmic electrode and a plan position of said third separation region is shorter than a thickness of said drift layer.

14. The semiconductor device according to claim 1, wherein a dimension of said third separation region in a direction in which said second well region sandwiches said first well regions therein is larger than a dimension of said third separation region in a direction perpendicular to the direction in which said second well region sandwiches said first well regions therein.

* * * * *